(12) United States Patent
Kunikiyo

(10) Patent No.: US 6,770,550 B2
(45) Date of Patent: *Aug. 3, 2004

(54) SEMICONDUCTOR DEVICE MANUFACTURING METHOD

(75) Inventor: Tatsuya Kunikiyo, Tokyo (JP)

(73) Assignee: Renesas Technology Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 25 days.

(21) Appl. No.: 09/441,889

(22) Filed: Nov. 17, 1999

(65) Prior Publication Data

US 2002/0123212 A1 Sep. 5, 2002

(30) Foreign Application Priority Data

May 17, 1999 (JP) .......................................... 11-135236

(51) Int. Cl.⁷ ..................... H01L 21/3205; H01L 21/00; H01L 21/336
(52) U.S. Cl. ..................... 438/585; 438/589; 438/981; 438/258; 438/264
(58) Field of Search ................................ 438/258, 259, 438/241, 591, 281, 291, 600, 264, 981, 585, 589

(56) References Cited

U.S. PATENT DOCUMENTS

| | | | |
|---|---|---|---|
| 3,979,241 A | | 9/1976 | Maeda |
| 5,478,436 A | | 12/1995 | Winebarger et al. |
| 5,480,828 A | * | 1/1996 | Hsu et al. ...................... 437/56 |
| 5,502,009 A | * | 3/1996 | Lin ............................. 437/239 |
| 5,591,681 A | * | 1/1997 | Wristers et al. ............. 437/240 |
| 5,668,035 A | * | 9/1997 | Fang et al. .................. 438/239 |
| 5,811,347 A | * | 9/1998 | Gardner et al. ............. 438/435 |
| 5,920,779 A | * | 7/1999 | Sun et al. .................... 438/275 |
| 5,926,729 A | * | 7/1999 | Tsai et al. .................... 438/591 |
| 5,963,841 A | | 10/1999 | Karlsson et al. |
| 6,033,998 A | * | 3/2000 | Aronowitz et al. ......... 438/786 |
| 6,063,704 A | | 5/2000 | Demirlioglu |
| 6,080,682 A | * | 6/2000 | Ibok ........................... 438/770 |
| 6,110,780 A | * | 8/2000 | Yu et al. ..................... 438/258 |
| 6,118,168 A | * | 9/2000 | Moon et al. ................ 257/513 |
| 6,156,620 A | * | 12/2000 | Puchner et al. ............. 438/400 |
| 6,323,106 B1 | * | 11/2001 | Huang et al. ............... 438/433 |

FOREIGN PATENT DOCUMENTS

| | | |
|---|---|---|
| JP | 59178762 | 10/1984 |
| JP | 2-47838 | 2/1990 |
| WO | WO97/36321 | 10/1997 |

OTHER PUBLICATIONS

"CMOS Metal Replacement Gate Transistors using Tantalum Pentoxide Gate Insulator", by Chatterjee et al., IEDM Technical Digest, 1998; pp. 777–780.

"High Performance Metal Gate MOSFETs Fabricated by CMP for 0.1 $\mu$m Regime", by Yagishita et al., IEDM Technical Digest, 1998; pp. 785–788.

* cited by examiner

Primary Examiner—Wael Fahmy
Assistant Examiner—Shrinivas H Rao
(74) Attorney, Agent, or Firm—McDermott, Will & Emery

(57) ABSTRACT

After a channel layer (7) containing nitrogen is formed in a channel region (5) in the main surface of a semiconductor substrate (1), a gate insulating film (9) and insulating films (10) are formed as oxide film by a thermal oxidation on the main surface of the semiconductor substrate (1). The insulating films (10) are thicker than the gate insulating film (9) because the oxidation reaction is suppressed in the nitrogen-introduced region. Further, stresses caused by the oxidation are suppressed-around the connections between the gate insulating film (9) and the insulating films (10). Accordingly, reduction in leakage current and improvement of gate insulating film reliability are compatibly realized.

26 Claims, 20 Drawing Sheets

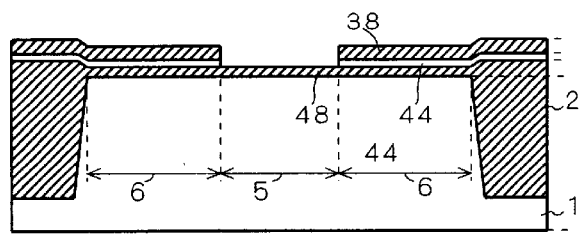
FIG. 50
FIG. 50A
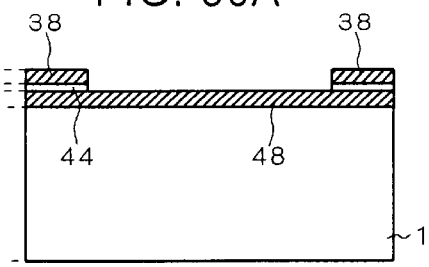
FIG. 51
FIG. 51A
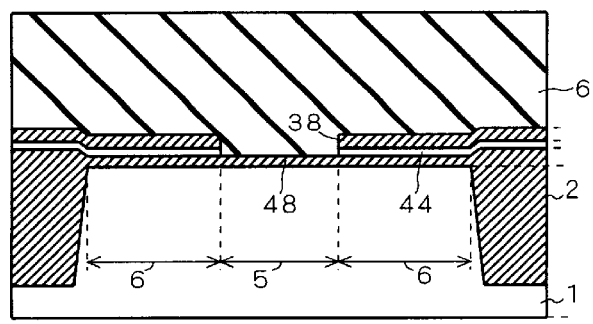
FIG. 52
FIG. 52A
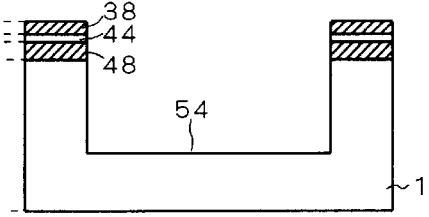
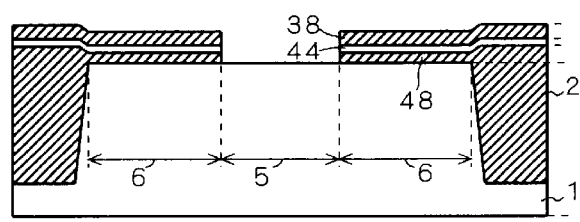
FIG. 53
FIG. 53A
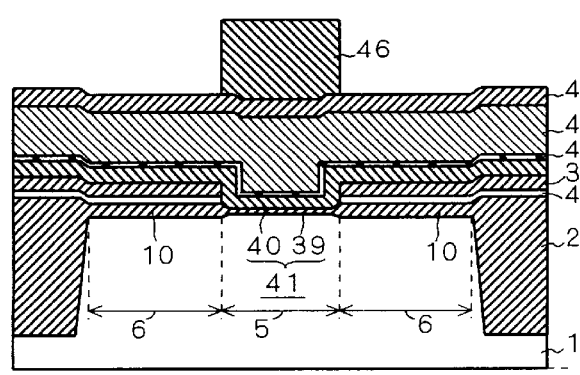
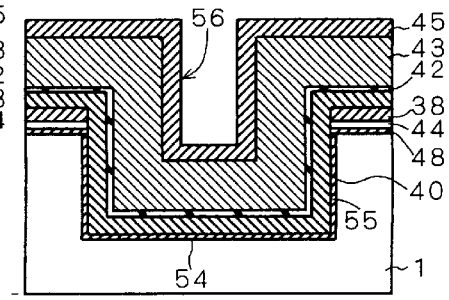

SEMICONDUCTOR DEVICE MANUFACTURING METHOD

BACKGROUND OF THE INVENTION

1. Field of the Invention

The present invention relates to a method of manufacturing a semiconductor device having an MOS structure (a structure having a channel region selectively formed in the main surface of a semiconductor substrate, a set of source/drain regions selectively formed in the main surface of the semiconductor substrate with the channel region therebetween, and a gate electrode facing the channel region through a gate insulating film), and particularly to an improvement for compatibly realizing reduction in leakage current and increase in gate insulating film reliability.

2. Description of the Background Art

FIGS. 55 and 56 are manufacturing process diagrams showing a conventional method for manufacturing a semiconductor device having the MOS structure, i.e., an insulated-gate semiconductor device. Particularly, this semiconductor device is constructed as an MOS transistor. In this specification, according to the common usage in this field of art, "MOS transistor" and "MOS structure" generally also include those having gate electrodes formed of conductors other than metal.

FIG. 55 is a front section of an intermediate structure obtained before formation of the gate electrode and FIG. 56 is a front section of an intermediate structure obtained after formation of the gate electrode. In the process shown in FIG. 55, first, an STI (Shallow Trench Isolation) 102 is formed in the main surface of the semiconductor substrate 101. The STI 102 is formed by selectively forming a trench having a depth of about 0.2 to 0.3 μm in the main surface of the semiconductor substrate 101 and then burying an insulating film in the trench. The STI 102 is formed to separate a set of adjacent elements. In this specification, STI as a structure and STI as an element isolation method are both represented as "STI."

Subsequently, a well implantation and a channel-cut implantation are performed to form a well layer and a channel-cut layer in the semiconductor substrate 101. FIG. 55 does not show the well layer and the channel-cut layer.

Next, a gate insulating film 103 is formed on the main surface of the semiconductor substrate 101. The gate insulating film 103 is formed as a silicon oxide film by performing a thermal oxidation in an $H_2O$ atmosphere, $O_2$ atmosphere, $N_2O$ atmosphere, NO atmosphere, or $NO/O_2$ atmosphere, for example. The gate insulating film 103 may be formed by depositing a high-dielectric-constant film such as $Ta_2O_5$. The gate insulating film 103 usually has a thickness of about 1.5 to 8 nm, though it depends on the rated value of the power-supply voltage.

Deposited next on the gate insulating film 103 are a film of polysilicon 104 doped with phosphorus at a concentration of $5\times10^{20}/cm^3$ and having a thickness of 0.1 μm, a WSix (tungsten silicon compound; x=2, 3) film 105 having a thickness of 0.1 μm, and an insulating film 106 having a thickness of 0.05 μm, in this order. These films are deposited by using CVD (Chemical Vapor Deposition). The gate electrode is formed later from the two-layer structure of the polysilicon film 104 and the WSix film 105. In other cases, the gate electrode may be formed by using a metal material, such as W and Co, in place of the polysilicon/WSix two-layer structure.

Next, resist (photoresist) is applied on the insulating film 106 and then the resist is patterned by a transfer process to form a resist 107. The insulating film 106 is deposited on the WSix film 105 for the purpose of preventing halation, specifically, to prevent the phenomenon in which the resist 107 is finished in smaller size than the transferred mask due to reflecting light from the layer underlying the resist in the transfer process. The insulating film 106 can serve to prevent halation because the insulating film 106 has a smaller reflectance than the WSix film 105.

Next, the process shown in FIG. 56 is performed. In the process of FIG. 56, first, an anisotropic etching is performed by using the resist 107 as a mask to selectively remove the insulating film 106, the WSix film 105, and the polysilicon film 104. As a result, the gate electrode 110 is formed as a two-layer structure having the polysilicon film 104 and the WSix film 105. Reactive ion etching (RIE) is used as the anisotropic etching for forming the gate electrode 110.

After that, impurity ions are selectively implanted into the main surface of the semiconductor substrate 101 by using the gate electrode 110 and the insulating film 106 thereon as masks. As a result, in the main surface of the semiconductor substrate 101, source/drain layers (the generic name of the source layer and the drain layer) 111 are formed in the source/drain regions (the generic name of the source region and the drain region) 109 opposing through the channel region 108 right under the gate electrode 110.

In the conventional MOS transistor, the gate electrode 110 and the source/drain layers 111 are formed as described above. For example, when the MOS transistor is of n-channel type, the conductivity type of the channel region 108 is p type and the conductivity type of the source/drain layers 111 is n type.

As shown in FIG. 56, in the anisotropic etching process for forming the gate electrode 110, the polysilicon film 104, the WSix film 105, and the insulating film 106 are selectively removed in the areas located above the source/drain regions 109 and the STI 102. In this process, the resist 107 used as a mask is etched away, too. In the anisotropic etching, over etching is implemented to prevent the resist 107 from partially remaining unremoved.

When the over etch starts, the insulating film 106, the WSix film 105, and the polysilicon film 104 located above the source/drain regions 109 have been already removed by etching, with only the insulating films 103b remaining. While the resist 107 is mainly etched in the over etching, part of the insulating film 106 and part of the gate insulating films 103b are etched, too. Accordingly, the insulating films 103b on the source/drain regions 109 become thinner than the gate insulating film 103a on the channel region 108.

In reactive ion etching, $CF_4$ becomes radicals in the form of CFx (x=1, 2, 3) in a plasma, and then they are accelerated by electric field in the ion sheath and transported to the surface of the WSix 105 and polysilicon film 104, which form the gate electrode 110. Then the radicals cut the bonds of W—Si, Si—Si, etc. and remove silicon components and tungsten components in the form of $SiF_2$, $WF_2$, etc.

At the same time, the radicals accelerated in the electric field and energized enter the oxide film, silicon, etc. for about 10 nm depth at the maximum. Then, as the insulating films 103b become thinner, the following phenomena become more serious: the radicals (CFx) enter the main surface of the semiconductor substrate 101 to form levels (i.e., donor or acceptor levels), radiation damage (damage caused by radiation) occurs in the main surface of the semiconductor substrate 101 and the gate insulating film, and W atoms (or ions) emitted from the WSix 105 by sputtering enter the main surface of the semiconductor substrate 101 to form levels. The damaged layers 112 shown in FIG. 56 represent the radiation-damaged and level-formed layers in the main surface of the semiconductor substrate 101.

While most of the radiation damage is annealed out (eliminated by annealing) in thermal treatment process performed later in a nitrogen atmosphere, C, W, and the like remain near the main surface of the semiconductor substrate 101. When these levels are covered by a depletion layer, then SRH (Shockley-Read-Hall) current and TAT (Trap Assisted Tunnel) current increase, both of which cause leakage current in gate-off state. According to simulation, it is known that the electric field strength is as high as $5 \times 10^5$ V/cm or more in the gate end regions 113 (FIG. 56) when the gate is off. Particularly, since the TAT current exponentially increases with the electric field strength, the leakage current becomes considerably large due to the formation of levels. The increase in leakage current increases the power consumed when the semiconductor device is in the stand-by state. This problem is especially serious when the semiconductor device is used in portable electronic equipment which operates with battery.

Aside from this problem, Japanese Patent Laying-Open No.2-47838 discloses a semiconductor device manufacturing method in which, for the purpose of enhancing the breakdown voltage between the gate electrode and drain electrode, the insulating film on the source/drain regions is formed thicker than that on the channel region before reactive ion etching process for forming the gate electrode. FIGS. 57 and 58 are manufacturing process diagrams showing the manufacturing method disclosed in the reference.

In the process shown in FIG. 57, first, the STI 102 is selectively formed in the main surface of the semiconductor substrate 101 and then a well implant and a channel-cut implant are performed. This forms a well layer and a channel-cut layer in the semiconductor substrate 101. FIG. 57 does not show the well layer and the channel-cut layer.

Next, the gate insulating film 103 is formed as an oxide film on the main surface of the semiconductor substrate 101 and then a nitride film (silicon nitride film) 114 is deposited thereon. Subsequently, resist is applied on the nitride film 114 and the resist is patterned through a transfer process. Then the nitride film 114 is selectively removed by etching using the patterned resist as a mask. As a result, as shown in FIG. 57, the nitride film 114 remains unremoved only above the channel region 108.

Next, the process shown in FIG. 58 is performed. In the process of FIG. 58, first, a thermal treatment is performed in an oxidation atmosphere to form the gate insulating films 120 and 121 on the main surface of the semiconductor substrate 101. During this process, in the channel region 108, the nitride film 114 prevents the oxidizing agent from moving to the main surface of the semiconductor substrate 101, so that the oxidation rate in the channel region 108 is lower than that in the source/drain regions 109. Accordingly, the gate insulating film 120 on the channel region 108 becomes thinner than the gate insulating films 121 on the source/drain regions 109. Then bird's beaks 115 are formed at the connections between the gate insulating film 120 and the gate insulating films 121.

Since the gate insulating films 121 on the source/drain regions 109 are formed thicker in the manufacturing method shown in FIGS. 57 and 58, this method provides not only the effect of enhancing the breakdown voltage between the gate electrode and drain electrode but also the effect of alleviating the trouble from which the manufacturing method shown in FIGS. 55 and 56 has been suffering, that is, it also provides the effect of suppressing the increase in leakage current caused as the gate insulating film 103 is over etched. However, since large stresses occur at and near the bird's beaks 115 in the manufacturing method of FIGS. 57 and 58, the interface level density is high at and near the bird's beaks 115, leading to another problem of shorter lifetime of the gate insulating film 120.

SUMMARY OF THE INVENTION

According to the first aspect of the present invention, in a method of manufacturing a semiconductor device having a channel region selectively formed in a main surface of a semiconductor substrate, a set of source/drain regions selectively formed in the main surface of the semiconductor substrate with the channel region interposed therebetween, and a gate electrode facing the channel region through a gate insulating film, the method comprises: (a) a step of preparing the semiconductor substrate; (b) a channel position selecting step of selectively introducing nitrogen into the main surface of the semiconductor substrate in an area which corresponds to the channel region; (c) an oxidation step of, after the channel position selecting step, oxidizing the main surface of the semiconductor substrate to form an insulating film on the main surface so that the insulating film is formed thicker on the set of source/drain regions than on the channel region; (d) a step of depositing an electrode material on the insulating film; and (e) a gate formation step of selectively removing the electrode material by using a selective etching to form the gate electrode.

According to the second aspect of the present invention, in a method of manufacturing a semiconductor device having a channel region selectively formed in a main surface of a semiconductor substrate, a set of source/drain regions selectively formed in the main surface of the semiconductor substrate with the channel region interposed therebetween, and a gate electrode facing the channel region through a gate insulating film, the method comprises: (a) a step of preparing the semiconductor substrate; (b) a step of oxidizing the main surface of the semiconductor substrate to form an insulating film on the main surface; (c) a channel position selecting step of depositing a polycrystalline semiconductor film and a semiconductor nitride film in this order on the insulating film in an area located above the channel region; (d) an oxidation step of, after the channel position selecting step, oxidizing the main surface of the semiconductor substrate so that the insulating film becomes thicker in the set of source/drain regions than in the channel region; (e) a step of removing the polycrystalline semiconductor film and the nitride film; (f) a step of depositing an electrode material on the insulating film; and (g) a gate formation step of selectively removing the electrode material by using a selective etching to form the gate electrode.

According to the third aspect of the present invention, in a method of manufacturing a semiconductor device having a channel region selectively formed in a main surface of a semiconductor substrate, a set of source/drain regions selectively formed in the main surface of the semiconductor substrate with the channel region interposed therebetween, and a gate electrode facing the channel region through a gate insulating film, the method comprises: (a) a step of preparing the semiconductor substrate; (b) a channel position selecting step of introducing an impurity into the main surface of the semiconductor substrate in areas which correspond to the set of source/drain regions at such a concentration that enhanced reaction occurs in oxidation reaction; (c) an oxidation step of, after the channel position selecting step, oxidizing the main surface of the semiconductor substrate to form an insulating film on the main surface so that the insulating film is formed thicker in the set of source/drain regions than in the channel region; (d) a step of depositing an electrode material on the insulating film; and (e) a gate formation step of selectively removing the electrode material by using a selective etching to form the gate electrode.

Preferably, by the step (b), the source/drain regions are formed.

According to the fourth aspect of the present invention, in a method of manufacturing a semiconductor device having a channel region selectively formed in a main surface of a semiconductor substrate, a set of source/drain regions selectively formed in the main surface of the semiconductor substrate with the channel region interposed therebetween, and a gate electrode facing the channel region through a gate insulating film, the method comprises: (a) a step of preparing the semiconductor substrate; (b) a step of oxidizing the main surface of the semiconductor substrate to form an insulating film on the main surface; (c) a channel position selecting step of applying a selective etching to selectively remove the insulating film on the channel region; (d) an oxidation step of, after the step (c), oxidizing the main surface of the semiconductor substrate to form on the channel region an insulating film thinner than the insulating film on the set of source/drain regions; (e) a step of depositing an electrode material over the insulating films on the channel region and the source/drain regions; and (f) selectively removing the electrode material by using a selective etching to form the gate electrode.

Preferably, the step (c) comprises: (c-1) depositing a semiconductor oxide film on the insulating film; (c-2) depositing a semiconductor nitride film on the semiconductor oxide film; and (c-3) applying selective etching to selectively remove the semiconductor nitride film, the semiconductor oxide film, and the insulating film over the channel region.

According to the fifth aspect of the present invention, in any one of the first to fourth aspects, the semiconductor device manufacturing methods further comprise a step (A) of heating at a temperature of 950° C. or higher after the oxidation step.

According to the sixth aspect of the present invention, in any one of the first to fourth aspects, the semiconductor device manufacturing methods further comprise a step (B) of forming a mark in an area other than the channel region and the source/drain regions in the main surface of the semiconductor substrate, wherein positioning in the process in the channel position selecting step and positioning of the mark in the step (B) are achieved by transferring a common mask pattern, and in the gate formation step, the position in which the electrode material is selectively removed is determined through transfer of another mask pattern, and the another mask pattern is positioned on the basis of the position of the mark.

According to the seventh aspect of the present invention, in the sixth aspect, a trench is formed as the mark in the step (B).

Preferably, in the step of depositing the electrode material, the electrode material is also deposited on an inner surface of the trench, and the method further comprises a step of: (C) after the step of depositing and before the gate formation step, removing the electrode material from the inner surface of said trench.

Preferably, in the oxidation step, the insulating film is also formed on an inner surface of the trench, and in the step (C) the insulating film is also removed from the inner surface of the trench.

According to the eighth aspect of the present invention, in a method of manufacturing a semiconductor device having a channel region selectively formed in a main surface of a semiconductor substrate, a set of source/drain regions selectively formed in the main surface of the semiconductor substrate with the channel region interposed therebetween, and a gate electrode facing the channel region through a gate insulating film, the method comprises: (a) a step of preparing the semiconductor substrate; (b) a step of oxidizing the main surface of the semiconductor substrate to form an insulating film on the main surface; and (c) a channel position selecting step of applying a selective etching to selectively remove the insulating film on the channel region; wherein the step (c) comprises: (c-1) depositing a film on the insulating film; and (c-2) applying selective etching to selectively remove the film deposited in the step (c-1) and the insulating film over the channel region, and said method further comprises: (d) an oxidation step of, after the channel position selecting step, oxidizing the main surface of the semiconductor substrate to form on the channel region an insulating film thinner than the insulating film on the set of source/drain regions; (e) a step of depositing an electrode material over the insulating films on the channel region and the source/drain regions; (f) a gate formation step of polishing the electrode material so as not to leave the same on the film deposited in the step (c-1) but to selectively leave over the channel region to form the gate electrode; and (g) removing the film deposited in the step (c-1).

Preferably, the method further comprises a step (A) of heating at a temperature of 950° C. or higher after the step (e).

According to the manufacturing method of the first aspect, the insulating film is formed thicker in the source/drain regions than in the channel region because the oxidation reaction is suppressed in the nitrogen-introduced region. This suppresses introduction of levels (i.e., donor or acceptor levels) into the source/drain regions in the gate formation step, thus reducing the leakage current of the completed semiconductor device. Furthermore, since the insulating film uneven in thickness is formed by utilizing a difference in oxidation reaction rate between the nitrogen-introduced region and other region, stresses caused in the insulating film by the oxidation can be reduced. This suppresses an increase in interface level density around the insulating film corresponding to the gate insulating film, thus improving the reliability of the gate insulating film.

According to the manufacturing method of the second aspect, the insulating film is formed thicker in the source/drain regions than in the channel region because the oxidation reaction is suppressed in the region covered with the semiconductor nitride film. This suppresses introduction of levels into the source/drain regions in the gate formation step, thus reducing the leakage current of the completed semiconductor device. Furthermore, since the semiconductor nitride film covers the channel region through the polysilicon film, stresses caused in the insulating film by the oxidation can be suppressed. This suppresses an increase in interface level density around the insulating film corresponding to the gate insulating film, thus improving the reliability of the gate insulating film.

According to the manufacturing method of the third aspect, the insulating film is formed thicker in the source/ drain regions than in the channel region because the oxidation reaction is promoted in the impurity-introduced region. This suppresses introduction of levels in the source/drain regions in the gate formation step, thus reducing the leakage current of the completed semiconductor device. Furthermore, since the insulating film uneven in thickness is formed by utilizing a difference in oxidation reaction rate between the impurity-introduced region and other region, stresses caused in the insulating film by the oxidation can be suppressed. This suppresses an increase in interface level density around the insulating film corresponding to the gate insulating film, thus improving the reliability of the gate insulating film.

According to the manufacturing method of the fourth aspect, the insulating film is formed thicker in the source/drain regions than in the channel region. This suppresses introduction of levels into the source/drain regions in the gate formation step, thus reducing the leakage current of the completed semiconductor device. Furthermore, stresses caused at the insulating film by the oxidation can be suppressed, since the insulating film uneven in thickness is formed by once forming an insulating film, selectively removing the insulating film, and then selectively forming a thinner insulating film. This suppresses an increase in interface level density around the insulating film corresponding to the gate insulating film, thus improving the reliability of the gate insulating film.

According to the manufacturing method of the fifth aspect, the thermal treatment at a temperature of 950° C. or higher further suppresses the occurrence of stresses in the insulating film by the effect of viscous fluidity of the insulating film.

According to the manufacturing method of the sixth aspect, the gate electrode can accurately be formed above the channel region in the gate formation step because the mask pattern is positioned on the basis of the mark. Furthermore, since the positioning in both of the formation of the mark and the channel position selecting step is achieved through a transfer of a common mask pattern, the mask pattern used in the gate formation step can be positioned with sufficiently reduced error.

According to the manufacturing method of the seventh aspect, since a trench is formed as the mark, a side surface of a step can be used as the mark. Accordingly the mark can be detected easily and the alignment can be achieved precisely.

According to the manufacturing method of the eighth aspect, the gate electrode is formed through "damascene method" with a reduced leakage current and an improved reliability of the gate insulating film.

The present invention has been made to solve the above-described problems in the conventional manufacturing methods, and an object of the present invention is to provide a semiconductor device manufacturing method which can compatibly realize reduction in leakage current and improvement of gate insulating film reliability.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 49 to 54 are process diagrams showing a manufacturing method of a ninth preferred embodiment.

DESCRIPTION OF THE PREFERRED EMBODIMENTS

Now manufacturing methods according to preferred embodiments of the present invention will be described in relation to semiconductor devices having MOS structure, that is, insulated-gate semiconductor devices. Although MOS transistors, particularly N-type MOS transistors, will be described as examples of the semiconductor devices, applications of the present invention are not limited to the MOS transistors. Also, while the following description shows examples using a silicon substrate whose base material is silicon, which is very useful as semiconductor substrate, the present invention is not limited to these examples.

1. First Preferred Embodiment

First, a method for manufacturing a semiconductor device according to the first preferred embodiment will be described.

(1.1 Manufacturing Processes)

Figure 1:
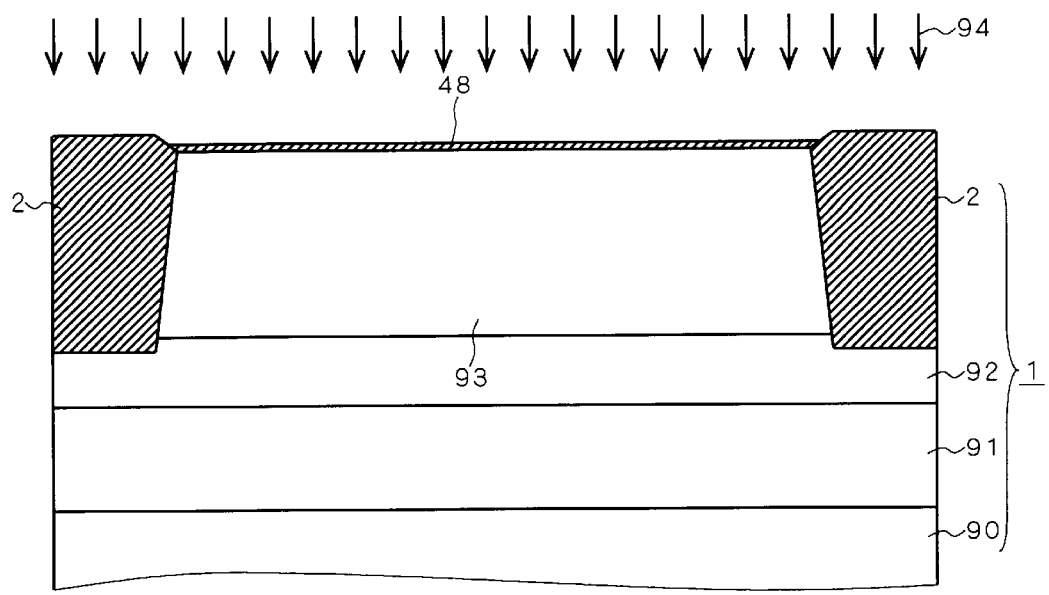
FIGS. 1 to 7 are process diagrams showing a manufacturing method of a first preferred embodiment.

FIGS. 1 to 7 are manufacturing process diagrams showing the semiconductor device manufacturing method of the first preferred embodiment. In this method, the process shown in FIG. 1 is performed first. In the process of FIG. 1, first, a semiconductor substrate 1 is prepared as a silicon semiconductor substrate having a main surface. Subsequently, an STI 2 is selectively formed in the main surface of the semiconductor substrate 1. The STI 2 is formed by selectively forming a trench of a depth of about 0.2 to 0.3 $\mu$m, for example, in the main surface of the semiconductor substrate 101 and then burying insulating film, e.g. silicon oxide film, in the trench. The STI 2 is formed for the purpose of isolating a set of adjacent elements.

Next, an underlying oxide film 48 is formed on the main surface of the semiconductor substrate 1. The underlying oxide film 48 is formed as a silicon oxide film for the purpose of protecting the semiconductor substrate 1 in the process steps. After that, impurity ions 94 are implanted as well implant and channel-cut implant, so as to form a well layer 91 and a channel-cut layer 92 in the semiconductor substrate 101. The semiconductor layers 90 and 93 correspond to layers in which neither of the well layer 91 nor the channel-cut layer 92 is formed in the semiconductor substrate 101. The channel-cut layer 92 is formed in contact with the bottom of the STI 2 and the well layer 91 is located under the channel-cut layer 92.

The processes for forming the well layer 91 and the channel-cut layer 92 are not described in detail, since they are conventionally known processes. The well layer 91 and the channel-cut layer 92 will not be shown in the following diagrams.

Figure 2:
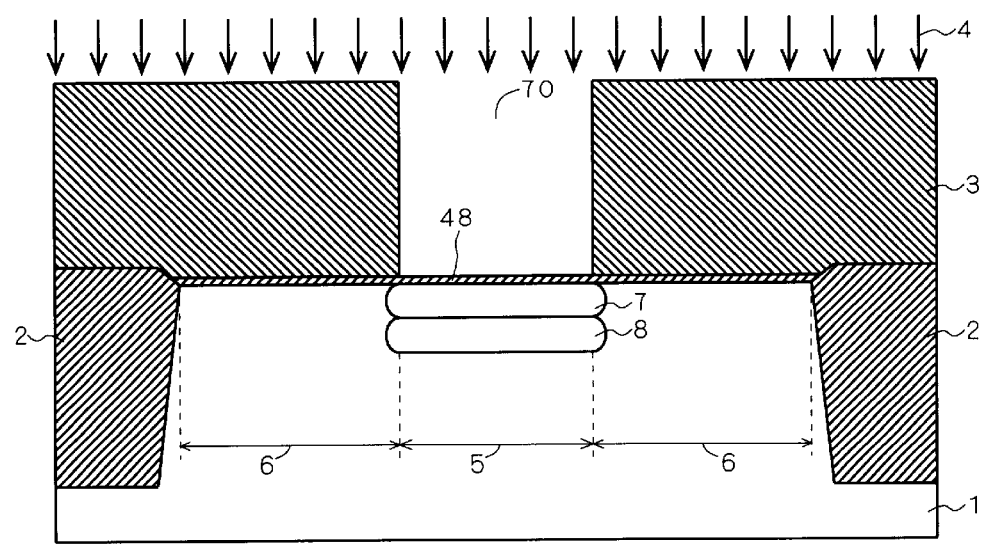

Next, the process shown in FIG. 2 is performed. In the process of FIG. 2, first, resist (photoresist) is applied over the entire surface of the structure, that is, on the underlying oxide film 48 and the STI 2. The underlying oxide film 48 may be once removed as sacrifice oxide film prior to the application of resist, in which case the underlying oxide film 48 is then formed again. This removes contaminants on the main surface of the semiconductor substrate 1. After that, the resist is patterned by a transfer process to form the resist 3.

The region interposed between a set of adjacent parts of STI 2 in the main surface of the semiconductor substrate 1 is utilized as a region for formation of an MOS transistor (MOS transistor region). A channel region 5 and a set of source/drain regions 6 on both sides thereof are defined in the MOS transistor region. The resist 3 is formed to have an opening 70 above the channel region 5.

After formation of the resist 3, nitrogen ions are selectively implanted as ions 4 into the main surface of the semiconductor substrate 1 by using the resist 3 as a mask. The implantation of nitrogen ions is performed with an implantation energy of 10 keV and a dose of $5 \times 10^{15}/cm^2$, for example. Next, boron (B) ions are selectively implanted as the ions 4 into the main surface of the semiconductor substrate 1 by using the resist 3 as a mask. The implantation of boron ions is performed with an implantation energy of 10 keV and a dose of $1 \times 10^{13}/cm^2$, for example. These ion implantations form a (first) channel layer 7 containing nitrogen in the channel region 5. If needed, boron ions may be further implanted as the ions 4 with an implantation energy of 30 keV and a dose of $1 \times 10^{13}/cm^2$, for example, to form a punch-through stopper layer 8.

While nitrogen and boron are selectively introduced into the main surface of the semiconductor substrate 1 by ion implantation in the example of FIG. 2, they may be introduced by using plasma doping method or ionized cluster beam method. The channel layer 7 and the punch-through stopper layer 8 are selectively formed for the purpose of reducing the junction capacitance in the source/drain regions 6 to improve the operating speed of the MOS transistor and for the purpose of reducing the leakage current. These effects will be described later.

Figure 3:
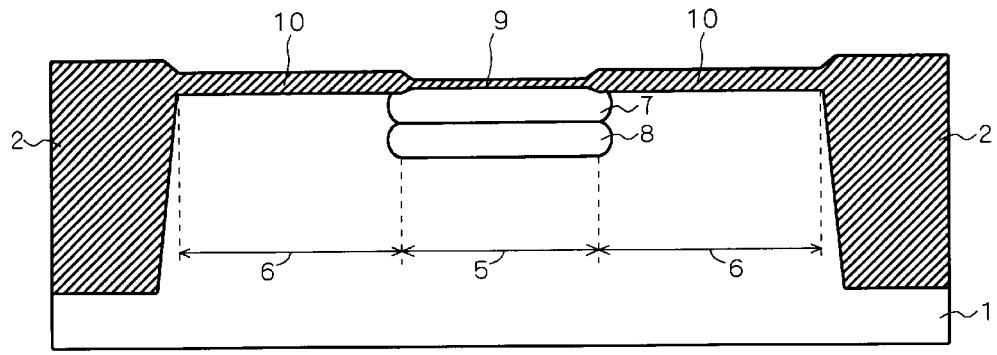

In the next process shown in FIG. 3, the resist 3 is removed first. Then a thermal oxidation is performed in a dry $O_2$ atmosphere. The thermal oxidation may be performed with the underlying oxide film 48 unremoved, or may be performed after the underlying oxide film 48 is removed in advance. As a result of the thermal oxidation, a gate insulating film 9 and insulating films 10 are formed on the main surface of the semiconductor substrate 1. The gate insulating film 9 is formed on the channel region 5 and the insulating films 10 are formed on the source/drain regions 6.

The channel layer 7 containing nitrogen exists in the part corresponding to the channel region 5 in the main surface of the semiconductor substrate 1. The nitrogen atoms contained in the channel layer 7 inhibit reaction of silicon, the main constituent atoms of the semiconductor substrate 1, with $O_2$ (oxygen), that is, it inhibits the oxidation reaction. The nitrogen atoms also inhibit diffusion of oxidizing agent in the gate insulating film 9 as a silicon oxynitride film formed by the oxidation reaction. Accordingly the oxidation rate (the reaction rate of the oxidation reaction) is slower on the nitrogen-implanted channel region 5 than on the source/drain regions 6 not implanted with nitrogen.

As a result, the insulating films 10 formed on the source/drain regions 6 become thicker than the gate insulating film 9 formed on the channel region 5. While the gate insulating film 9 is formed as a silicon oxynitride film as stated above, the insulating films 10 are formed as a silicon oxide film. If the gate insulating film 9 has a thickness of 3 nm, for example, the thickness of the insulating films 10 is about 10 nm.

In place of an oxidation atmosphere, an $NO/O_2$ atmosphere may be used. In this case, the gate insulating film 9 is formed as a silicon oxynitride film and the insulating films 10 are formed as a silicon oxynitride film, too. Also when the thermal oxidation is performed in an $NO/O_2$ atmosphere, the rate of reaction between oxygen and silicon is suppressed lower on the channel region 5 than on the source/drain regions 6, and therefore the insulating films 10 become thicker than the gate insulating film 9 also in this case. Further, the silicon oxynitride film exists as the insulting films 10 right under sidewalls formed in a later process, which provides the advantage of improving hot carrier resistance.

Figure 4:
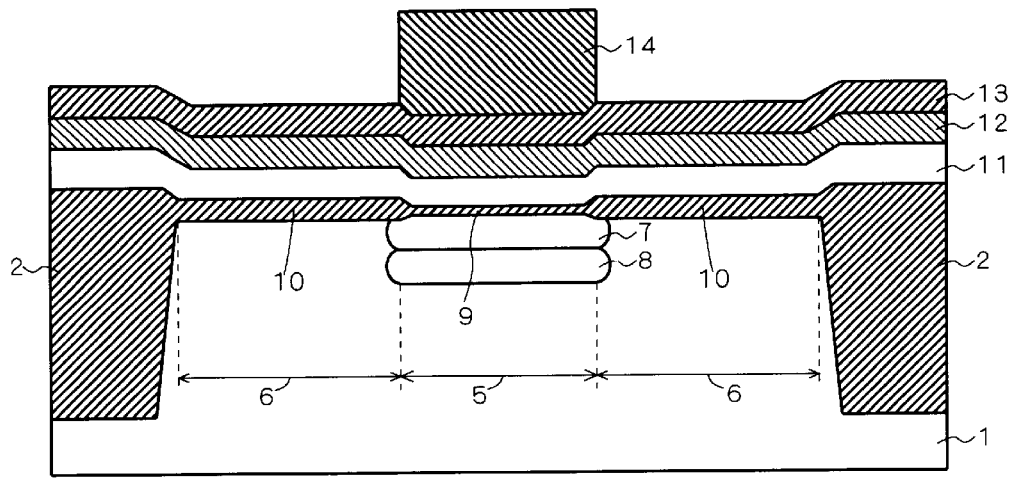

In the next process shown in FIG. 4, first, a polysilicon film 11, a WSix film (tungsten silicide film; x=2 to 3) 12, and an insulating film 13 are deposited in this order to cover the entire upper surface of the structure, that is, to cover the surface of the gate insulating film 9, the insulating films 10, and the STI 2. For example, the polysilicon film 11 is formed as a 0.1-$\mu$m-thick polysilicon film doped with phosphorus at a concentration of $8 \times 10^{20}/cm^3$. The WSix film 12 is formed to a thickness of 0.1 $\mu$m, for example. The insulating film 13 is formed to a thickness of 0.1 $\mu$m, for example.

Next, resist is applied on the insulating film 13 and the resist is patterned through a transfer process. A resist 14 is thus selectively formed on the insulating film 13. The resist 14 is formed above the channel region 5. Accurate alignment (positioning) between the resist 14 and the channel region 5 can be relatively easily achieved because of the difference in height at the boundaries between the channel region 5 and the source/drain regions 6. Alignment mark may be formed in other region on the semiconductor substrate 1 to further increase the alignment accuracy.

Figure 5:
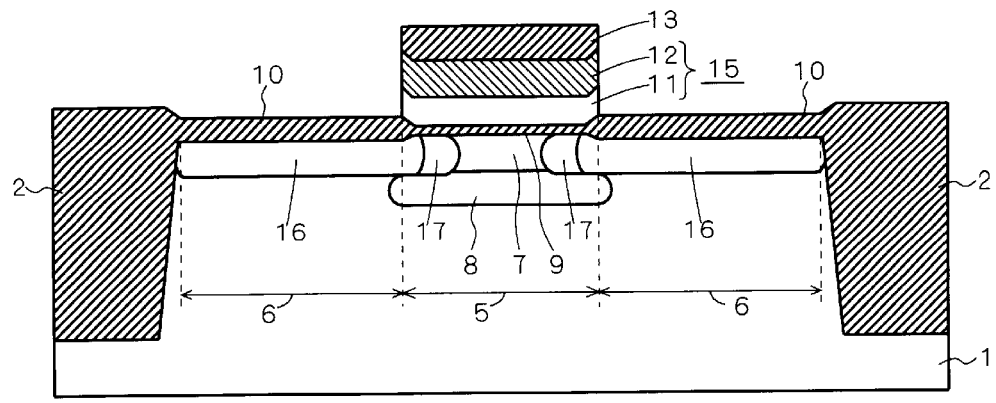

In the next process shown in FIG. 5, first, a reactive ion etching (RIE) is performed by using the resist 14 as a mask to selectively remove the polysilicon film 11, WSix film 12, and insulating film 13. Then the gate electrode 15 having a two-layer structure of the polysilicon film 11 and WSix film 12 is formed. The insulating film 13 remains on the gate electrode 15.

In the reactive ion etching for forming the gate electrode 15, $CF_2/H_2$ or $CF_2/O_2$ is used as etching gas, for example. In the reactive ion etching, over etching is done so that the resist 14 is not left. Accordingly, while part of the insulating films 10 on the source/drain regions 6 are etched, the thickness of the resist 14 and other conditions are set so that the reactive ion etching is stopped before the insulating films 10 become thinner than the gate insulating film 9 on the channel region 5.

For example, when the gate insulating film 9 is 3 nm thick and the insulating films 10 are 10 nm thick before the reactive ion etching, the thickness of the insulating films 10 becomes 9 nm after the over etching. Hence, as compared with a conventional NMOS transistor having a 3-nm-thick insulating films 10 on the source/drain regions 6, the amount of radicals (CFx; x=1, 2, 3) and sputtered metal electrode constituent atoms (W in this example) introduced into the semiconductor substrate 1 during the reactive ion etching can considerably be reduced.

When radicals or metal atoms exist in the vicinity of the gate edges in which a depletion layer is formed when the MOS transistor operates, they function as levels (i.e., donor or acceptor levels) and then leakage current is caused by the current generated by SRH or the tunnel current by TAT. However, in the method of this preferred embodiment, the thick insulating films 10 suppress formation of the levels, thus effectively reducing the leakage current.

Figure 58:
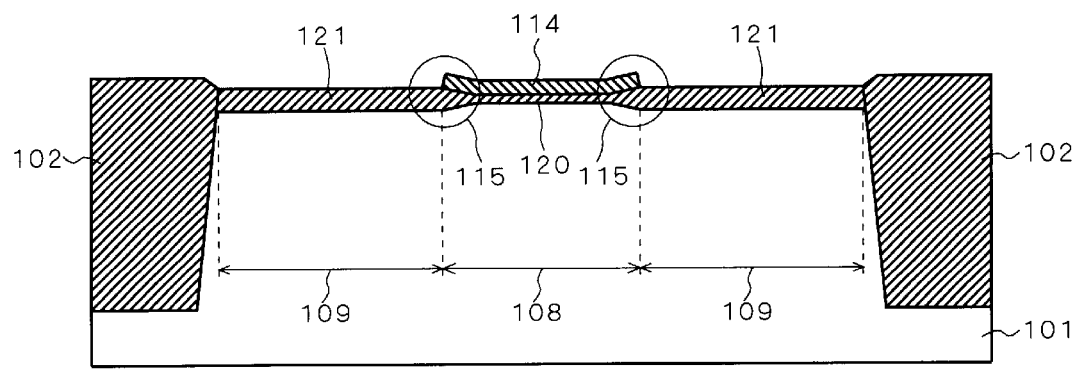

Furthermore, without forming a shield like the silicon nitride film 114 (FIG. 58) on the channel region 5, the gate insulating film 9 and the insulating films 10 are formed to different thicknesses by utilizing the difference in oxidation reaction rate between the channel region 5 containing nitrogen and the source/drain regions 6 not containing nitrogen. This reduces occurrence of stresses caused by the thermal oxidation around the connections between the gate insulating film 9 and the insulating films 10. Then the interface level density around the connections will not increase, thus lengthening the lifetime of the gate insulating film 9 and enhancing the reliability. As described above, the manufacturing method of this preferred embodiment compatibly achieves the reduction in leakage current and the improvement of reliability of the gate insulating film 9, which could not be achieved by conventional techniques.

Next, arsenic is selectively ion-implanted into the main surface of the semiconductor substrate 1 by using the gate electrode 15 and the insulating film 13 thereon as masks, with an implantation energy of 20 keV and a dose of $1 \times 10^{14}/cm^2$, for example. As a result, (first) source/drain layers 16 are formed in a self-aligned manner in the source/drain regions 6 in the main surface of the semiconductor substrate 1.

Next, boron is selectively ion-implanted into the main surface of the semiconductor substrate 1 by using the gate electrode 15 and the insulating film 13 thereon as masks, by rotational ion implantation with an implantation energy of 10 keV, a dose of $1 \times 10^{13}/cm^2$, and an angle of incidence of 30°. As a result, (second) channel layers 17 are formed, which somewhat penetrate into the channel region 5 from the ends of the source/drain regions 6 in the main surface of the semiconductor substrate 1.

The channel layers 17 are formed to smooth roll-off of the gate threshold voltage, that is, to suppress the short-channel effect, and to suppress the surface punch-through. Further, the thick insulating films 10 prevent the ends of the gate insulating film 9 from being damaged by boron implantation when boron is obliquely implanted by rotational ion implantation into the semiconductor substrate 1.

Figure 6:
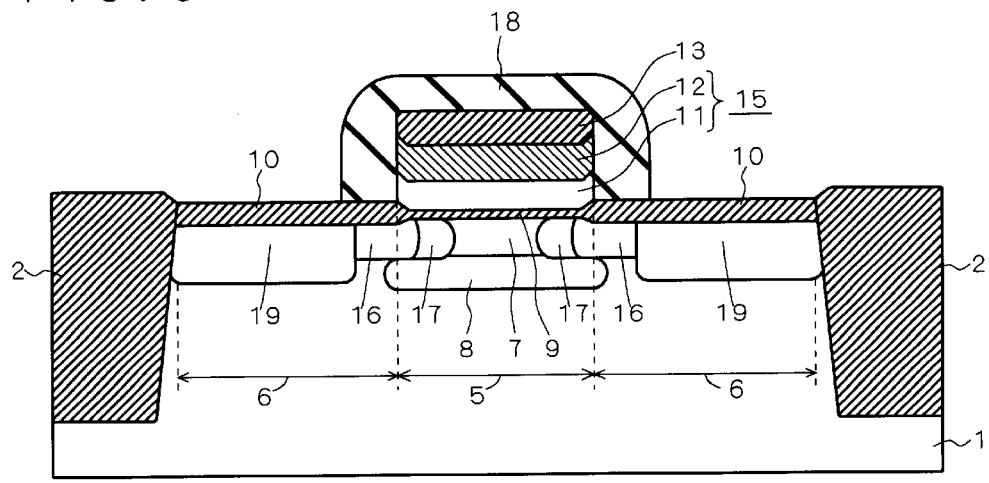

In the next process shown in FIG. 6, first, an insulating film is deposited to a thickness of 0.08 μm, for example, on the entire surface of the structure. Subsequently, the insulating film is selectively removed by reactive ion etching to form a sidewall 18 covering the sides of the gate electrode 15 (and the insulating film 13 thereon). In this process, the insulating films 10 on the source/drain regions 6 are also etched for about 1 nm.

While CFx radicals are introduced into the semiconductor substrate 1 also in the reactive ion etching for forming the sidewall 18, the sidewall 18 allows the radicals to enter only the areas backed from the ends of the source/drain layers 16 which face to the channel region 5 in the main surface of the semiconductor substrate 1. Accordingly the radicals introduced into the semiconductor substrate 1 are covered by the source/drain layers 16 as heavy impurity concentration layers, not by a depletion layer, and they do not cause leakage current.

Subsequently, arsenic is selectively ion-implanted into the main surface of the semiconductor substrate 1 by using the sidewall 18 as a mask, with an implantation energy of 40 keV and a dose of $5 \times 10^{51}/cm^2$, for example. As a result, (second) source/drain layers 19 are formed in the source/drain regions 6 in the main surface of the semiconductor substrate 1. The ends of the source/drain layers 19 which face to the channel region 5 are located back from the ends of the source/drain layers 16 which face to the channel region 5.

Figure 7:
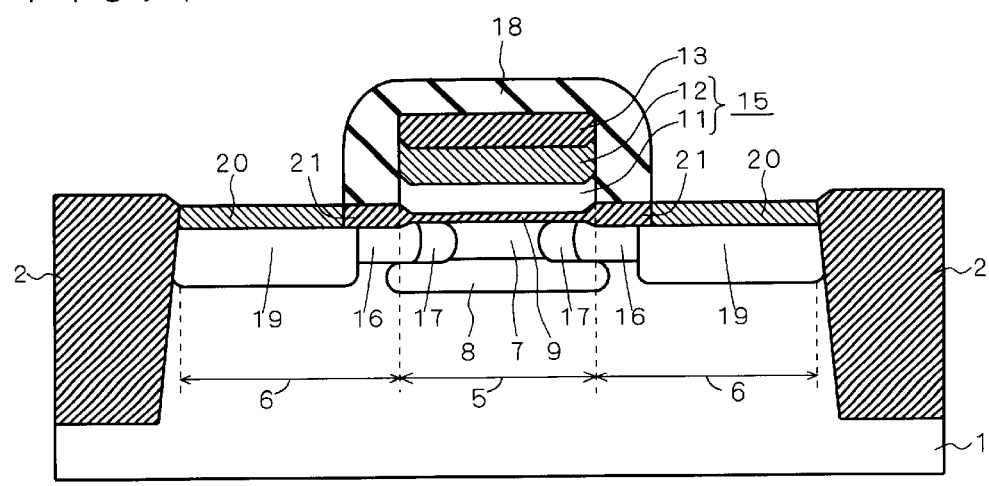

In the next process shown in FIG. 7, the insulating films 10 is partially removed by etching in the areas which are located on the source/drain regions 6 and not covered by the sidewall 18. As a result, the main surface of the semiconductor substrate 1 is selectively exposed in the source/drain regions 6 and the insulating films 10 is left only right under the sidewall 18 as insulating films 21. After that, cobalt is deposited on the entire surface of the structure including the exposed surface of the semiconductor substrate 1. Next, RTA process is performed at 1050° C. for about 15 seconds. As a result, films of cobalt silicide ($CoSi_2$) 20 are formed on the exposed surface and the impurities implanted in prior process are electrically activated.

While the cobalt film on the exposed surface reacts with silicon in the RTA process to form the cobalt silicide films 20, the cobalt film lying on the insulating film remains unreacted in the RTA process and remains as a cobalt film. The cobalt film on the insulating film is then removed by etching and the structure shown in FIG. 7 is obtained. Thus, an NMOS transistor is completed.

When the gate electrode 15 has a single-layer structure only with the polysilicon film 11 and the upper surface of the gate electrode 15 is exposed without covered by the insulating film when the cobalt is deposited, then a two-layer structure of the polysilicon film 11 and the cobalt silicide film is formed as the gate electrode 15. Nitrogen may be implanted into the gate electrode 15 and the source/drain regions 6 before depositing cobalt, with an implant energy of 10 keV and a dose of $5 \times 10^{15}/cm^2$, for example. This prevents aggregation of the cobalt silicide during the RTA process, which enables formation of a less-leakage, low-resistance, and relatively stable cobalt silicide film in the gate electrode 15 and the source/drain regions 6.

When aggregation occurs, spikes of $CoSi_2$ may occur at the interface between the $CoSi_2$ and Si. When spikes occur, the electric field is concentrated to the spikes to cause leakage current. Implanting nitrogen in advance suppresses the occurrence of spikes and reduces the leakage current. The same effect can be obtained also with Ti (titanium) or Ni (nickel) silicide.

(1.2. Advantages)

Figure 8:
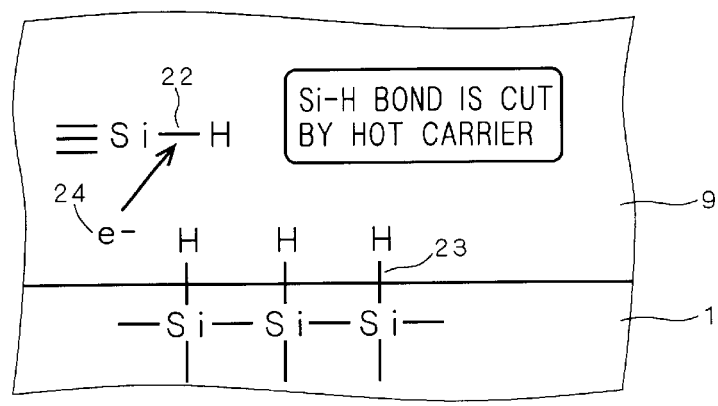
FIGS. 8 to 10 are schematic diagrams used to explain the process of deterioration of the gate insulating film.
Figure 9:
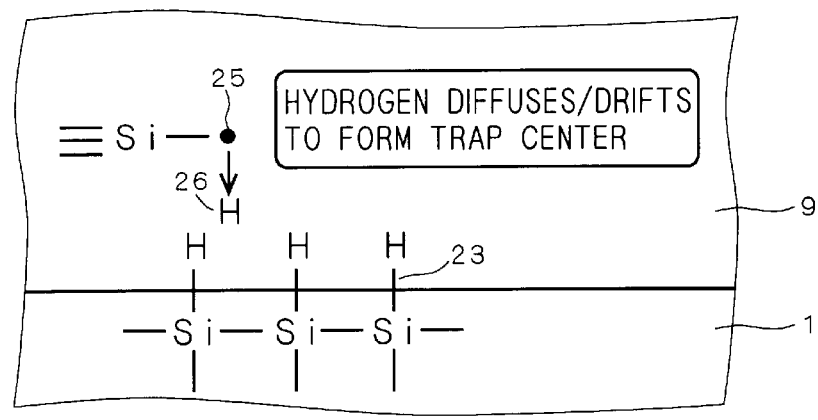
Figure 10:
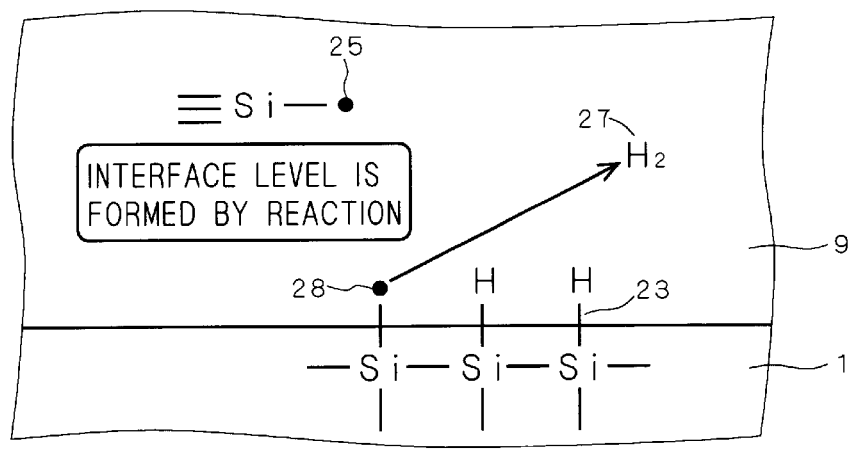

Now the advantages of the manufacturing method of the first preferred embodiment will be described in greater detail. First, another mechanism by which the nitrogen ion implantation improves the reliability of the gate insulating film 9 will be described. FIGS. 8 to 10 are explanation diagrams schematically showing the process in which the gate insulating film 9 as a silicon oxide film deteriorates during the use of the semiconductor device. In these diagrams, FIG. 8 schematically shows the Si—H bond 22 in the gate insulating film 9 and the Si—H bond 23 at the interface between the gate insulating film 9 and the semiconductor substrate 1.

When a thermal oxidation is performed in an $H_2O$ atmosphere, hydrogen atoms in $H_2O$ are taken into the silicon oxide film. When a thermal oxidation is done in a dry $O_2$ atmosphere, hydrogen is not mixed into the silicon oxide film but water ($H_2O$) in air is taken in later. Further, when the polysilicon film 11 is deposited by CVD, hydrogen generated by the reaction based on chemical formula 1 is taken into the gate insulating film 9. $H_2O$ and $H_2$ taken into the silicon oxide film react with SiO, the main component of the silicon oxide film, to form Si—H bond.

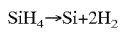

$$SiH_4 \rightarrow Si + 2H_2 \qquad \text{(chemical formula 1)}$$

When an MOS transistor operates, hot carriers having higher energy than energy barrier between silicon and silicon oxide film are injected from the semiconductor substrate 1 to the gate insulating film 9. The injected hot carriers cut the Si—H bond 22. As shown in FIG. 9, the hydrogen atom 26 dissociates from the broken Si—H bond 22 and a fixed level (trap center) 25 is then formed. The dissociated hydrogen atom 26 moves to the interface between the gate insulating film 9 and the semiconductor substrate 1 while repeatedly drifting and diffusing due to the effect of electric field in the gate insulating film 9.

As shown in FIG. 10, when the hydrogen atom 26 reaches the interface, then it reacts with H atom contained in the Si—H bond 23 present at the interface and generates an $H_2$ molecule. The generated $H_2$ molecule is released as gas. This forms the interface level 28 at the interface. The reaction between the hydrogen atom 26 and the Si—H bond 23 existing at the interface is represented by the following chemical formula 2.

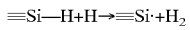

$$\equiv Si-H + H \rightarrow \equiv Si\cdot + H_2 \qquad \text{(chemical formula 2)}.$$

The process shown in FIGS. 8 to 10 is repeated to increase the density of the trap centers 25 and interface levels 28. This causes problems such as variations of gate threshold voltage, reduction in drain current, etc. That is to say, the reliability of the gate insulating film 9 is reduced.

When nitrogen ion implantation is implemented, nitrogen is introduced into the semiconductor substrate 1 (and the gate electrode 15). Then, nitrogen is thermally diffused in the thermal treatment after the nitrogen ion implantation to reach the gate insulating film 9, the sidewall 18, and the insulating films 21 right under the sidewall 18. Nitrogen has the effect of stopping up the broken Si—H bonds to form Si—N and the effect of suppressing diffusion and drift of hydrogen.

Thus nitrogen prevents the formation of fixed levels (trap centers) which is caused when hot carriers cut the Si—H bonds in the insulating film. Also, it suppresses the formation of interface levels by preventing the uncoupled H atoms from diffusing or drifting to the interface between the insulating film and semiconductor substrate 1 to react with Si—H existing at the interface. This enhances the hot carrier resistance. The manufacturing method of this preferred embodiment further effectively improves the reliability and lifetime of the gate insulating film 9 through the above-described mechanism by the nitrogen ion implantation.

Figure 11:
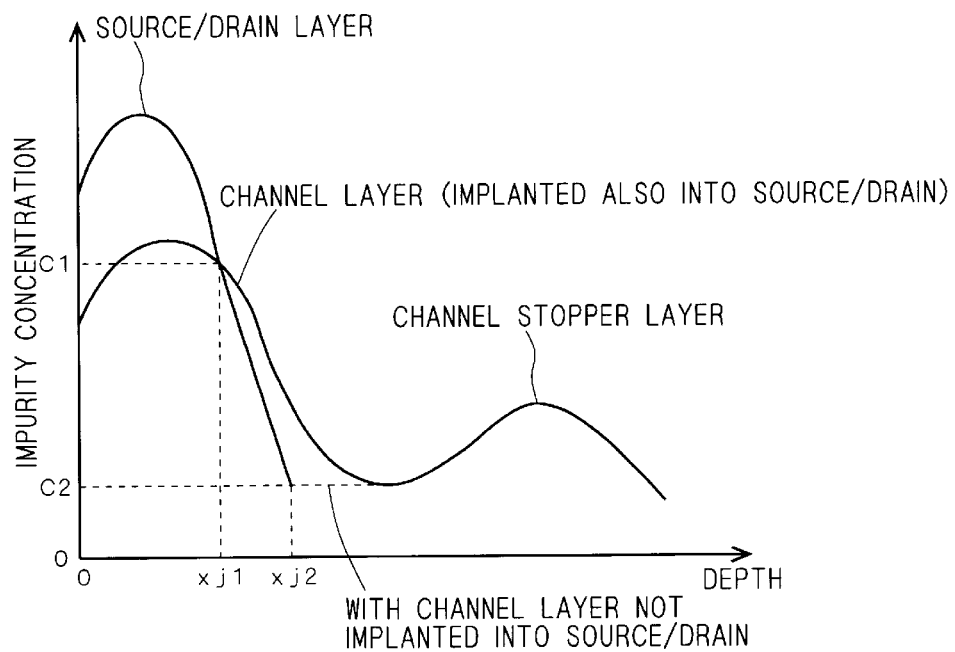
FIG. 11 is a graph showing an effect of the channel layer and the punch-through stopper layer.

Next, the mechanism by which the channel layer 7 and the punch-through stopper layer 8 enable higher speed operation of the MOS transistor and suppress the leakage current will be described. FIG. 11 is an explanation diagram showing this effect. The junction capacitance of the source/drain regions 6 is caused as charge is accumulated at both ends of the depleted pn junction. The thickness of the depletion layer becomes smaller when the impurity concentration at the junction is higher, and it becomes larger when the impurity concentration is lower. Since the junction capacitance is inversely proportional to the thickness of the depletion layer, the junction capacitance becomes smaller when the impurity concentration at the junction becomes lower.

In background art, the channel layer and the punch-through stopper layer are formed also in the source/drain regions, so that the impurity concentration at the junction in the depth direction in the source/drain regions is defined by the impurity concentration in the part where the channel layer and the punch-through stopper layer join the source/drain regions. On the other hand, in this preferred embodiment, the channel layer 7 is selectively formed and therefore the impurity concentration at the junction in the depth direction in the source/drain regions is defined by the impurity concentration at the junction with the channel stopper layer 92.

Generally, the impurity concentration in the channel stopper layer 92 is set lower than the impurity concentration in the channel layer 7 and the punch-through stopper layer 8, so that the impurity concentration at the junction in the depth direction in the source/drain layers is lower when the channel layer 7 is selectively formed as in this preferred embodiment. Then the thickness of the depletion layer becomes larger and the junction capacitance is reduced.

As mentioned above, the leakage current includes two components: current due to SRH process and current due to TAT. While the SRH current increases as the depletion layer becomes thicker, the TAT current increases as the electric field strength becomes higher. When the semiconductor elements are scaled down and the electric field strength inside the MOS transistor becomes higher, the TAT current becomes dominant over the SRH current.

In the manufacturing method of the preferred embodiment, the depletion layer becomes thicker since the impurity concentration at the junction is reduced, with which the electric field strength in the source/drain layers becomes lower. Then the TAT current is reduced, leading to reduction of the leakage current. Thus, in the manufacturing method of this preferred embodiment, the leakage current due to SRH current increases but the TAT current mainly contributing to the leakage current is reduced, resulting in reduction in the leakage current.

The operating speed of the MOS transistor can be enhanced by reducing the parasitic capacitance. The junction capacitance in the source/drain layers occupies a large part of the parasitic capacitance. Since the manufacturing method of this preferred embodiment reduces the junction capacitance, response of the MOS transistor becomes faster.

Figure 12:
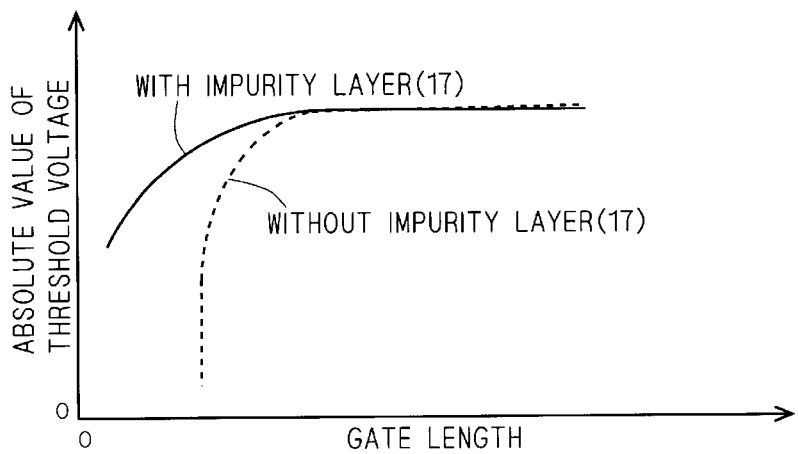
FIG. 12 is a graph used to explain another effect of the channel layer.

Next, the mechanism by which the channel layers 17 produce the effect of smoothing the roll-off of the gate threshold voltage will be described. FIG. 12 is a graph used to explain this effect, in which the horizontal axis shows the gate length and the vertical axis shows the absolute value (i.e., magnitude) of the gate threshold voltage. As shown in FIG. 12, in the absence of the channel layers 17, as the gate length becomes shorter, the absolute value of the gate threshold voltage rapidly decreases due to the short-channel effect. This curve is called roll-off curve.

On the other hand, in the presence of the channel layers 17, the decrease in the gate threshold voltage absolute value caused by the short-channel effect is suppressed because potential to carriers is newly formed. That is to say, the absolute value of the gate threshold voltage slowly decreases as the gate length decreases. The gate length varies to a certain extent among mass-produced semiconductor devices. Therefore, to secure given circuit operation, it is desired that the gate threshold voltage of the semiconductor devices less vary relative to the variations of the gate length.

(1.3. Modifications)

Figure 13:
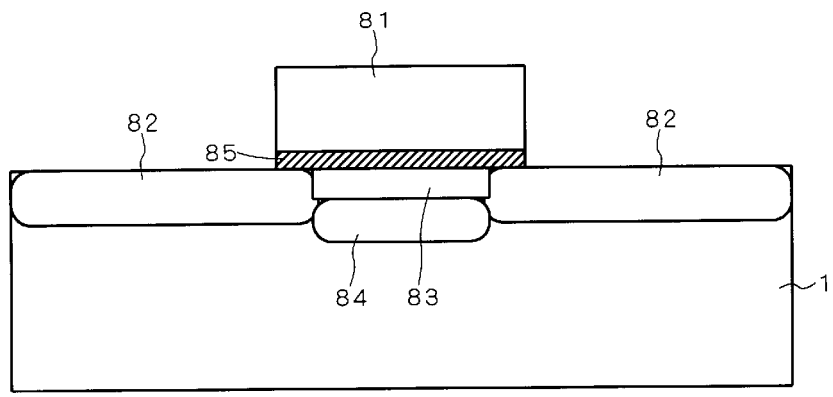
FIG. 13 is a sectional view of a semiconductor device showing a modification of the first preferred embodiment.

This preferred embodiment can be applied not only to semiconductor devices having the surface-channel type MOS structure exemplified in FIGS. 1 to 7 but also to semiconductor devices having buried-channel type MOS structure as shown in FIG. 13. The device shown in FIG. 13 has a set of p-type source/drain layers 82 selectively formed in the main surface of the semiconductor substrate 1 and a p-type channel layer 83 and an n-type punch-through stopper layer 84 selectively formed between them. The channel layer 83 is exposed in the main surface of the semiconductor substrate 1 and the punch-through stopper layer 84 is located under it. The gate electrode 81 faces the channel layer 83 through the gate insulating film 85.

In the surface-channel type MOS structure, an inversion layer is formed in the surface portion of the main surface of the semiconductor substrate 1. On the other hand, in the buried-channel type MOS structure, the minimum potential region (i.e. the region in which holes flow) is formed in an area separated away from the surface portion of the main surface. It is also possible to apply the manufacturing method of the preferred embodiment to the buried-channel type MOS transistor shown in FIG. 13 to compatibly realize the reduction in leakage current and the improvement of the gate insulating film reliability.

While the example of FIGS. 1 to 7 has shown a polysilicon/WSix two-layer structure for the structure of the gate electrode 15, this preferred embodiment can be applied also to devices adopting a metal electrode structure such as TiN/W etc. In this case, the suppression of leakage current and the improvement of the gate insulating film reliability can be realized compatibly, too.

Further, when Ge (germanium) is introduced into the source/drain regions 6 and thermally processed to form SiGe, the leakage current can further be reduced by the band gap difference between Si and SiGe. That is to say, the effect of this preferred embodiment can be further enhanced.

Moreover, while the manufacturing method of this preferred embodiment is suited for productions of MOS transistors as constituent elements of memory cells, logic gates, flash EEPROMs, etc., the method is not limited to them. The manufacturing method of this preferred embodiment is widely appropriate for productions of semiconductor devices having MOS structures having gate electrodes formed by reactive ion etching. This also applies to other preferred embodiments described below.

2. Second Preferred Embodiment

Figure 14:
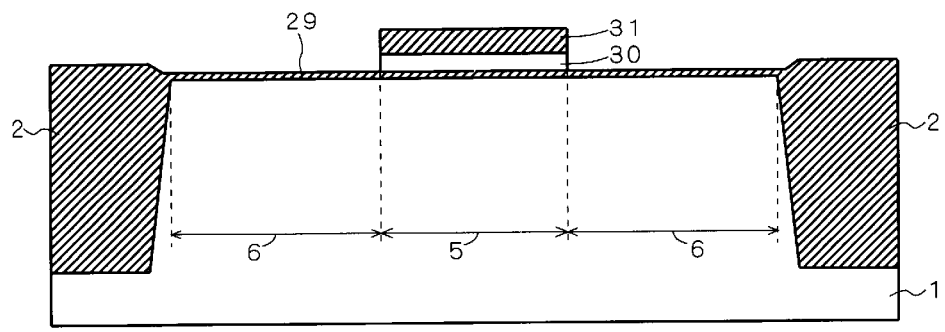
FIGS. 14 and 15 are process diagrams showing a manufacturing method of a second preferred embodiment.
Figure 15:
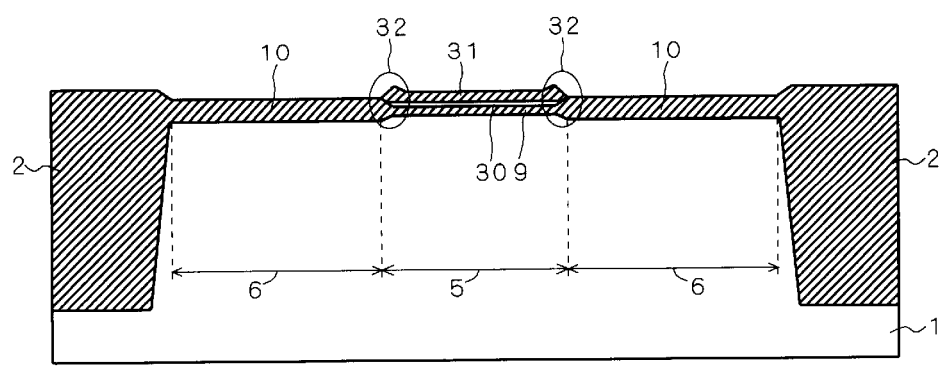

FIGS. 14 and 15 are manufacturing process diagrams showing a semiconductor device manufacturing method according to the second preferred embodiment. In the manufacturing method of this preferred embodiment, the process of FIG. 1 in the first preferred embodiment is first performed, which is followed by the process shown in FIG. 14.

In the process of FIG. 14, first, an insulating film 29 as a silicon oxide film is formed on the main surface of the semiconductor substrate 1 to a thickness of about 3 nm, for example. The insulating film 29 is formed by thermal oxidation after once removing the underlying oxide film 48, for example. For another method, the underlying oxide film 48 can be used as the insulating film 29 as it is. Next, a film of polysilicon and a film of silicon nitride are deposited in this order on the insulating film 29 and then patterned through transfer process and selective etching process to form a polysilicon film 30 and a nitride film (silicon nitride film) 31 above the channel region 5.

In the next process shown in FIG. 15, thermal oxidation is performed first. The thermal oxidation is performed in a dry $O_2$ atmosphere, for example. In the main surface of the semiconductor substrate 1, the oxidation rate is larger in the source/drain regions 6 exposed to the oxidation atmosphere than in the channel region 5 covered by the polysilicon film 30 and the nitride film 31. Accordingly, for example, while the thickness of the insulating films 10 formed as silicon oxide films on the source/drain regions 6 is about 9 nm, the thickness of the gate insulating film 9 also formed as a silicon oxide film on the channel region 5 is as small as about 3 nm.

Bird's beaks 32 are formed at the connections between the gate insulating film 9 and the insulating films 10. While oxidation may be implemented in a wet $O_2$ atmosphere, performing the thermal oxidation in dry $O_2$ atmosphere provides the advantage of shorting the bird's beaks 32. For apparatus used for the thermal oxidation, both of the oxidation furnace and the RTO (Rapid Thermal Oxidation) apparatus are usable. Further, an oxynitridation atmosphere can be used in place of the oxidation atmosphere, which provides the same structure as shown in FIG. 15.

When the process of FIG. 15 is finished, the nitride film 31 and the polysilicon film 30 are removed by etching. After that, the processes shown in FIGS. 4 to 7 in the first preferred embodiment are performed to complete the MOS transistor.

Also in this manufacturing method, the insulating films 10 on the source/drain regions 6 are formed thicker than the gate insulating film 9 on the channel region 5. This, as in the manufacturing method of the first preferred embodiment, prevents radicals CFx (x=1, 2, 3) and constituent atoms of metal electrode material from being introduced into the vicinities of the gate edges in the semiconductor substrate 1 during anisotropic etching for forming the gate electrode, thus reducing the leakage current.

Furthermore, the polysilicon film 30 covering the insulating film 29 in the part used as the gate insulating film 9 reduces oxidation induced stresses concentrated to the bird's beaks 32 near the gate ends. Also, the bird's beaks 32 can be shorter in length. This reduces defects and the density of interface levels caused by oxidation induced stresses, thus enhancing the reliability of the gate insulating film 9 and insulating films 10 to provide a MOS transistor with higher hot carrier resistance.

After the process of FIG. 15, the polysilicon film 30 and the nitride film 31 are removed by wet etching. And then, a thermal treatment can be performed at a temperature of 950° C. or higher in any of an oxidation atmosphere, oxynitridation atmosphere, and nitridation atmosphere. Removing the polysilicon film 30 and the nitride film 31 further reduces the stresses. Also, performing thermal treatment in the atmosphere at a temperature of 950° C. or higher further reduces the stresses applied to the bird's beaks 32 through the effect of viscous fluidity of the oxide film. When the thermal diffusion of the well layer, the channel-cut layer and the channel layer raise a serious problem during the thermal treatment at 950° C. or higher, these layers may be formed by ion implantation after the thermal treatment at 950° C. or higher.

Figure 16:
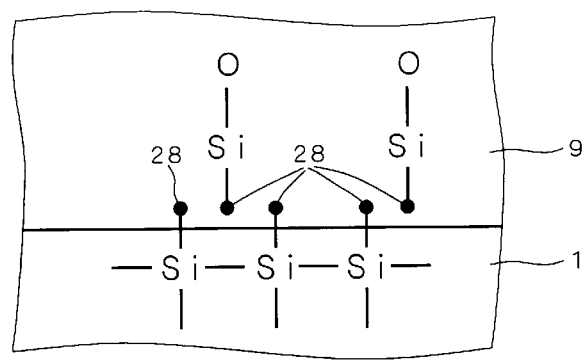
FIGS. 16 and 17 are schematic diagrams used to explain an effect of the second preferred embodiment.
Figure 17:
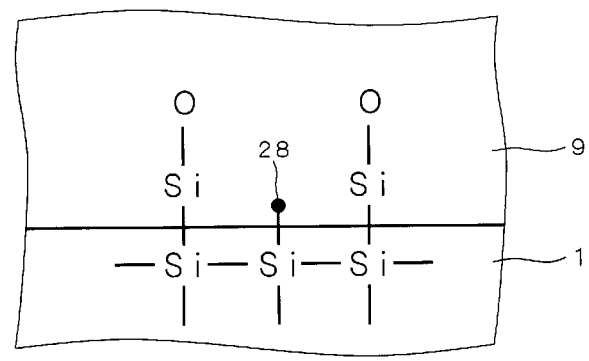

Next, the mechanism by which the interface level density decreases as the stresses are reduced will be described. FIGS. 16 and 17 are explanation diagrams for explaining this mechanism, which schematically show the interface between the insulating film 9 and the semiconductor substrate 1 and its vicinity. FIG. 16 corresponds to an example with large stresses, and FIG. 17 corresponds to small stresses.

When the stresses are large, as shown in FIG. 16, mismatch occurs at the atomic level between the insulating film 9 and the semiconductor substrate 1. On the other hand, with small stresses, as shown in FIG. 17, silicon atoms in the gate insulating film 9 and silicon atoms in the semiconductor substrate 1 are not uncoupled but are kept in strained state. With large stresses, the strain becomes so large that the bonds are cut as shown in FIG. 16, thus causing dangling bonds. The dangling bonds function as interface levels 28. The bonds are cut at a higher extent as the stresses become larger, and then the interface level density becomes higher.

As the interface level density becomes higher, carriers (electrons and holes) are trapped at the interface levels to form charged interface levels, and then the gate threshold voltage and the drain current vary more largely to reduce the reliability of the MOS transistor. On the other hand, the manufacturing method of this preferred embodiment can reduce the interface level density and suppress the variations of the gate threshold voltage and the drain current, thus improving the reliability of the MOS transistor.

3. Third Preferred Embodiment

Figure 18:
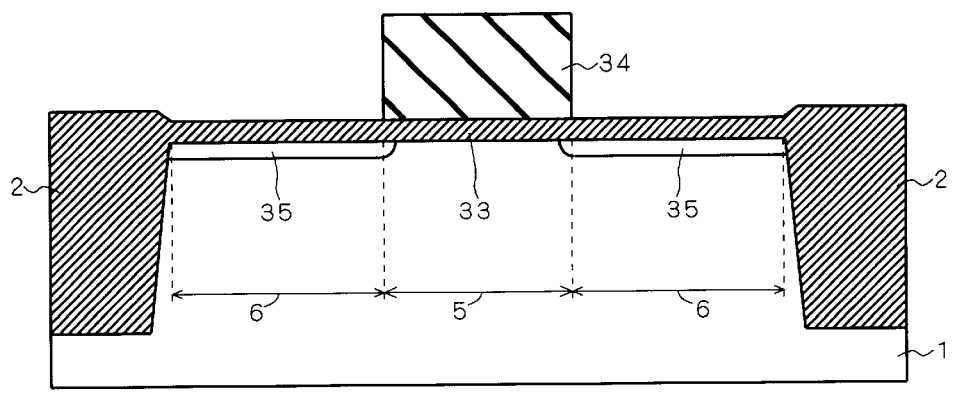
FIGS. 18 to 21 are process diagrams showing a manufacturing method of a third preferred embodiment.

FIGS. 18 to 21 are manufacturing process diagrams showing a semiconductor device manufacturing method of the third preferred embodiment. In the manufacturing method of this preferred embodiment, the process shown in FIG. 1 in the first preferred embodiment is first performed and then the process shown in FIG. 18 is performed.

In the process of FIG. 18, an underlying insulating film 33 is formed as a silicon oxide film on the main surface of the semiconductor substrate 1. The underlying insulating film 33 is formed after the underlying oxide film 48 is removed, for example. For another method, the underlying oxide film 48 may be used as the underlying insulating film 33 as it is. Next, resist is applied on the underlying oxide film 33 and then patterned to form a resist 34 which covers the underlying oxide film 33 on the channel region 5.

Next, an ion implantation or plasma doping is performed by using the resist 34 as a mask to form high-concentration impurity layers 35 having an impurity concentration of $10^{20}/cm^3$ or higher in a very shallow region in the main surface of the semiconductor substrate 1 in the areas corresponding to the source/drain regions 6.

Figure 19:
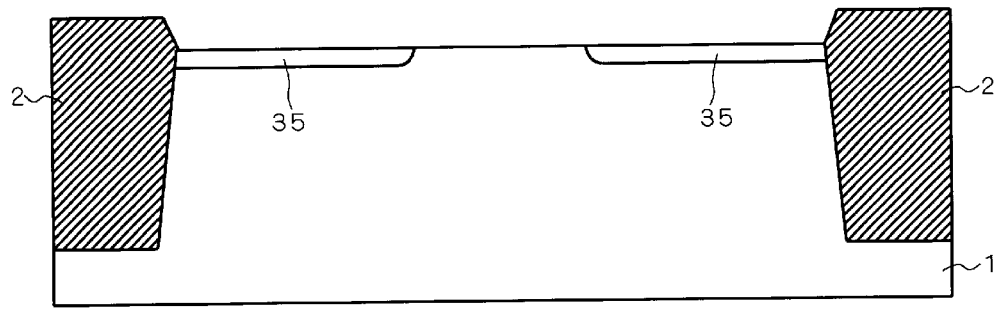
Figure 20:
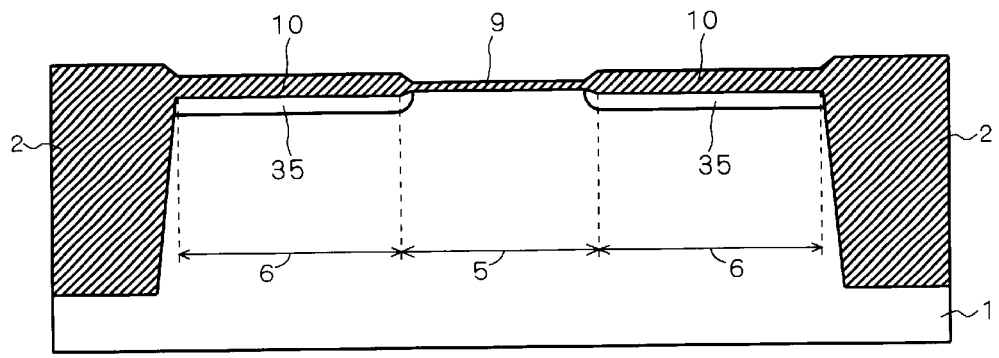

In the next process shown in FIG. 19, the resist 34 and the underlying oxide film 33 are removed. In the next process of FIG. 20, a thermal oxidation is performed. The oxidation rate in thermal oxidation depends on the concentration of impurity contained in the semiconductor. Specifically, while the oxidation rate is almost fixed in the impurity concentration range of $10^{20}/cm^3$ or lower, enhanced oxidation occurs if the impurity concentration is $10^{20}/cm^3$ or higher. The rate of enhancement is about twice to ten times, though it depends on the oxidation temperature and atmosphere. Enhanced oxidation occurs in the source/drain regions 6 because of the formation of the high-concentration impurity layers 35 and therefore the insulating films 10 formed on the source/drain regions 6 becomes thicker than the gate insulating film 9 formed on the channel region 5. After this, the processes as shown in FIGS. 4 to 7 in the first preferred embodiment are performed to complete the MOS transistor.

Also in the manufacturing method of this preferred embodiment, the insulating films 10 on the source/drain regions 6 are formed thicker than the gate insulating film 9 on the channel region 6. Furthermore, the gate insulating film 9 and the insulating films 10 are formed to different thicknesses by utilizing the difference in oxidation reaction rate caused by the difference in impurity concentration without forming a barrier like the nitride film 114 (FIG. 58) on the channel region 5, so that the occurrence of stresses caused by the thermal oxidation is reduced around the connections between the gate insulating film 9 and the insulating films 10. Thus, as in the manufacturing methods of the first and second preferred embodiments, the manufacturing method of this preferred embodiment, can compatibly realize the reduction in leakage current and the improvement of the reliability of the gate insulating film 9, too.

Figure 21:
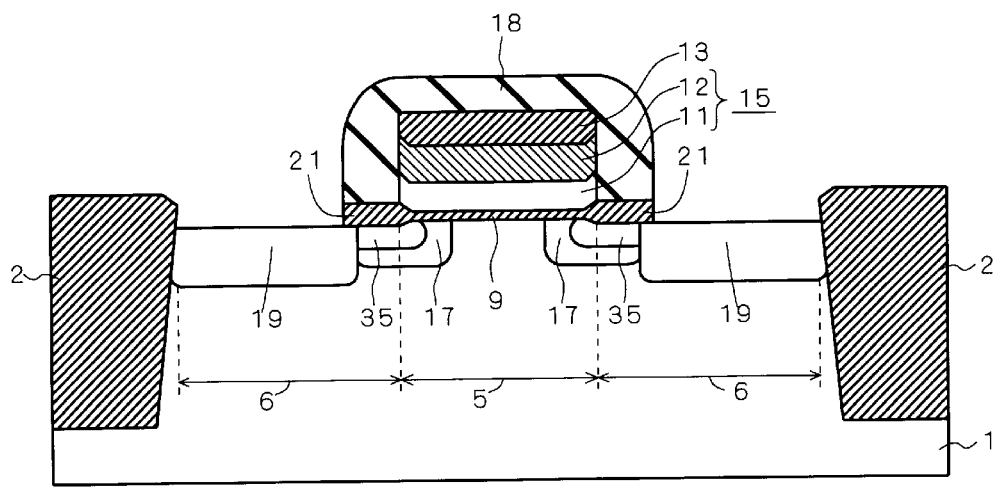

FIG. 21 shows a section of the structure obtained just before the silicide film is formed on the source/drain regions 6 in the process of FIG. 7. As shown in FIG. 21, in the manufacturing method of this preferred embodiment, the high-concentration impurity layers 35 can be used as the (first) source/drain layers. In this case, the impurity concentration in the high-concentration impurity layers 35 is set on the order of $10^{20}/cm^3$.

To enable the high-concentration impurity layers 35 to provide the same effects as the (first) source/drain layers 16 in the first preferred embodiment, the depth of its junction (the junction depth) is set smaller than the source/drain layers 16. When the junction becomes shallower, the resistance of the high-concentration impurity layers 35 becomes higher. While the resistance of the source/drain layers 16 is high because their impurity concentration is low, the resistance value of the high-concentration impurity layers 35 can be adjusted to be similar to that of the source/drain layers 16 by making the junction of the high-concentration impurity layers 35 shallower.

This resistance component provides the effect of reducing the electric field occurring at ends of the source/drain regions. This suppresses deterioration of the insulating film caused by hot carriers. When the high-concentration impurity layers 35 are used as the (first) source/drain layers 16, the impurity concentration of the (second) source/drain layers 19 is set higher than that of the high-concentration impurity layers 35 and the junction depth of the (second) source/drain layers 19 is set larger than that of the high-concentration impurity layers 35.

Instead of using the high-concentration impurity layers 35 as the (first) source/drain impurity layers, the high-concentration impurity layers 35 may be used as the (second) channel layers, or as part of the (second) source/drain layers. When the high-concentration impurity layers 35 are used as the (second) channel layers, the high-concentration impurity layers 35 are formed by boron implantation, for example, and they are used as the (second) channel layers 17 as they are. The channel implantation and the punch-through stopper implantation are implemented by using boron implantation and the first and second source/drain layers are formed by a conventional process of ion-implanting phosphorus or arsenic.

When the high-concentration impurity layers 35 are used as the (second) source/drain layers, the high-concentration impurity layers 35 are formed by arsenic implantation and they can be used as the (second) source/drain layers 19 as they are. In this case, unlike that shown in FIG. 18, the width of the resist 34 is set to the gate length plus the sidewall thickness, and the high-concentration impurity layers 35 are formed by ion-implanting arsenic by using the resist 34 as a mask. Other semiconductor layers can be formed by using conventional techniques.

As described above, the high-concentration impurity layers 35 can be used also for other semiconductor layers, then the high-concentration impurity layers 35 can be formed without increasing the manufacturing process steps.

4. Fourth Preferred Embodiment

Securing the current driving power of an MOS transistor whose gate length is reduced to 0.1 μm or smaller requires that the thickness of the gate insulating film mainly made of silicon dioxide should be set to 2 nm or smaller. However, since the scaling of the power-supply voltage is smaller as compared with the scaling of the gate length, tunneling directly occurs under this film thickness. Then the reliability of the gate insulating film will become lower than conventional ones. In order to secure the gate insulating film reliability while ensuring the current driving power, attempts are being made to use a high-dielectric-constant insulating film having higher dielectric constant than silicon dioxide, such as Oxynitride, $SiO_2/Si_3N_4/SiO_2$ (ONO film), $Ta_2O_5$ and $Al_2O_3$, as the gate insulating film.

Also, when the gate length is 0.1 μm or smaller, the line width of the gate becomes smaller to increase the gate resistance. To alleviate this problem, attempts are being made to use metal, such as W (tungsten), as the gate electrode in place of the conventional two-layer structure of doped polysilicon/WSix (x=2 to 3).

When W is used as the gate electrode and metal atoms like Ta (tantalum) and Al (aluminum) are contained in the high-dielectric-constant insulating film, then a larger number of defects and levels will be introduced into the semiconductor substrate when forming the gate electrode by reactive ion etching, which will further increase the leakage current. The manufacturing methods of fourth and fifth preferred embodiments described below are intended to compatibly achieve the reduction in leakage current and the improvement of the gate insulating film reliability also with MOS structure in which the gate electrode and the gate insulating film are adapted to the gate length of 0.1 μm or smaller.

Figure 22:
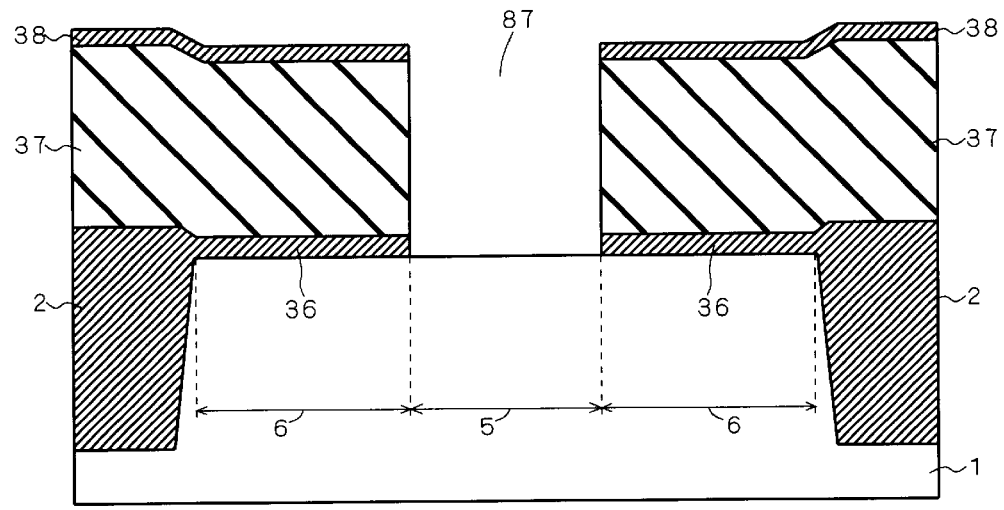
FIGS. 22 to 26 are process diagrams showing a manufacturing method of a fourth preferred embodiment.
Figure 23:
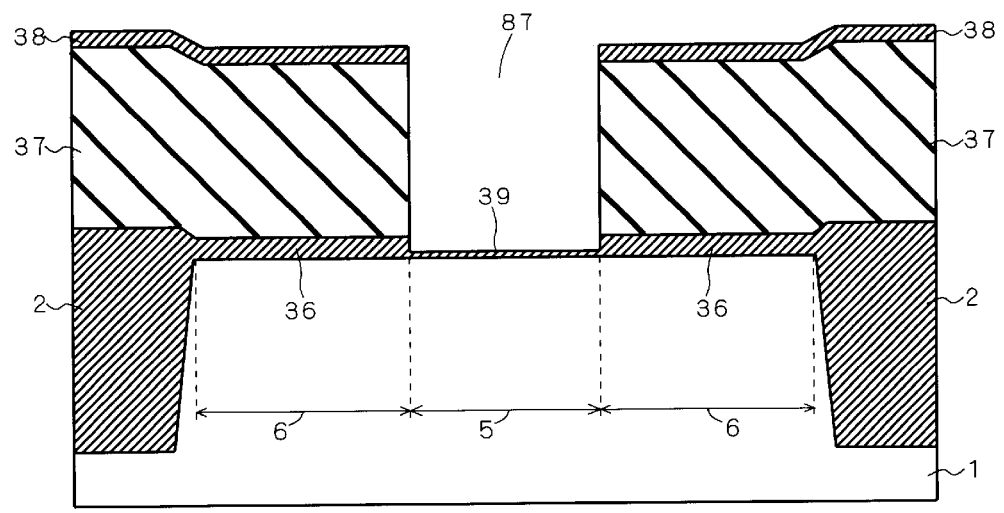

FIGS. 22 to 26 are manufacturing process diagrams showing the semiconductor device manufacturing method of the fourth preferred embodiment. The manufacturing method of this preferred embodiment is an improvement of the conventional method known as "damascene method." In the manufacturing method of this preferred embodiment, the process of FIG. 1 in the first preferred embodiment is performed first and then the process shown in FIG. 22 is performed.

In the process shown in FIG. 22, first, an oxide film (silicon oxide film) 36 is formed on the main surface of the semiconductor substrate 1. The oxide film 36 is formed by thermal oxidation after the underlying oxide film 48 is removed, for example. For another method, the underlying oxide film 48 may be used as the oxide film 36 as it is. Next, a TEOS film 37 and a nitride film (silicon nitride film) 38 are deposited in this order on the oxide film 36.

Subsequently, the oxide film 36, the TEOS film 37, and the nitride film 38 are patterned by selective etching using resist. FIG. 22 shows the structure obtained after the patterning. As a result of the patterning, the oxide film 36, TEOS film 37, and nitride film 38 form an opening 87 above the channel region 5. In the next process shown in FIG. 23, thermal oxidation is performed. This forms an oxide film (silicon oxide film) 39, which is thinner than the oxide film 36, on the main surface of the semiconductor substrate 1 in the area corresponding to the channel region 5.

Figure 24:
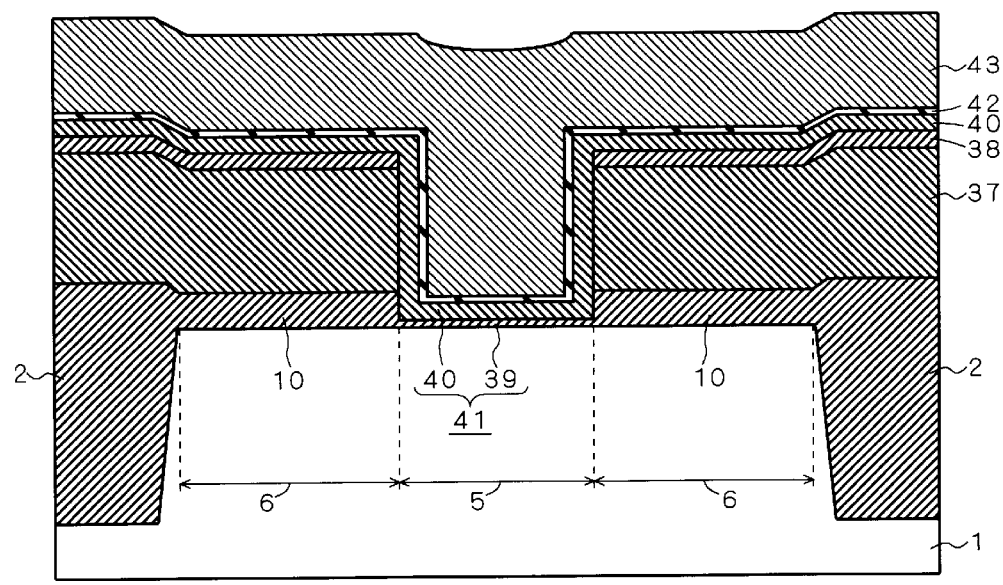

In the next process shown in FIG. 24, a high-dielectric-constant film 40, a titanium nitride film 42, and a tungsten film 43 are deposited in this order on the entire surface of the structure. In the three layers deposited, the oxide film 39 and the high-dielectric-costant film 40 form a gate insulating film 41. The thickness of the gate insulating film 41 is set smaller than the thickness of the insulating films 10 (which corresponds to the oxide film 36 covering the source/drain layers 6 in FIG. 22).

It is known that when the high-dielectric-constant film 40 is deposited directly on the semiconductor substrate 1, mismatch occurs at the interface between the high-dielectric-constant film 40 and the semiconductor substrate 1 because of their considerably different lattice constants, and then the interface level density becomes high due to dangling bond of silicon. On the other hand, in the method of this preferred embodiment, the interface level density can be suppressed low because the channel region 6 is covered by the oxide film 39 having a lattice constant similar to that of the semiconductor substrate 1. Further, the formation of the titanium nitride 42 prevents tungsten atoms forming the tungsten film 43 from diffusing to other region to form unwanted matters.

Figure 25:
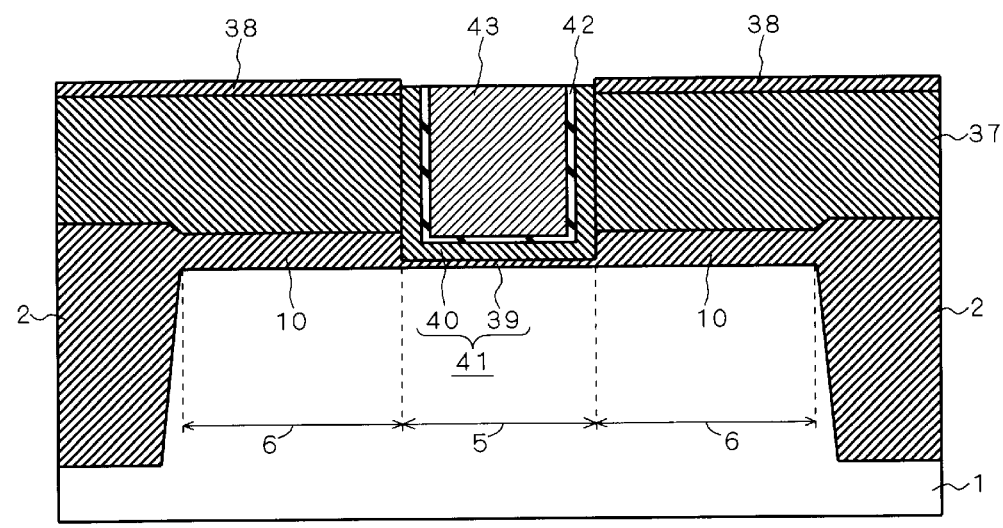

In the next process shown in FIG. 25, CMP (Chemical Mechanical Polishing) is performed. The nitride film 38 serves as a stopper in this process step. The gate electrode is thus formed.

Figure 26:
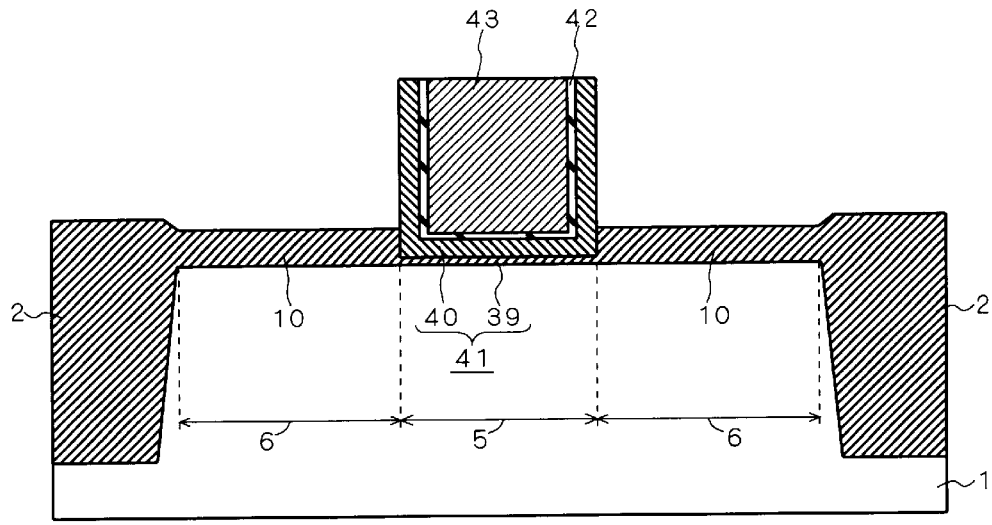

Performed next is the process shown in FIG. 26. In the process of FIG. 26, the nitride film 38 and the TEOS film 37 are removed by wet etching. During this process, the gate electrode hardly dissolves in the etching solution. While part of the oxide films 10 (surface portions) are removed by over etching while etching the TEOS film 37, the process is performed in such a way that the oxide film 10 remains thicker than the silicon oxide film 39 after etching. Subsequently, the processes of FIGS. 4 to 7 in the first preferred embodiment are performed to complete the MOS transistor.

Also in the manufacturing method of this preferred embodiment, the insulating films 10 on the source/drain regions 6 are formed thicker than the gate insulating film 41 on the channel region 5. Accordingly, even if metal (W) is used as the material of the gate electrode and the gate insulating film includes a high-dielectric-constant film, formation of defects and levels in the semiconductor substrate 1 can effectively be suppressed when forming the gate electrode by reactive ion etching. This reduces the leakage current.

Furthermore, since the gate insulating film 41 and the insulating films 10 are formed to different thicknesses through the processes of FIGS. 22 and 24 without forming a shield like the nitride film 114 (FIG. 58) on the channel region 5, it is possible to reduce the stresses caused by the thermal oxidation around the connections between the gate insulating film 41 and the insulating films 10. Accordingly, like the manufacturing methods of the first to third preferred embodiments, the manufacturing method of this preferred embodiment can compatibly realize the reduction in leakage current and the improvement of the reliability of the gate insulating film 41.

In the process from FIG. 25 to FIG. 26, the high-dielectric-constant film 40 on the sides of the gate electrode is somewhat etched and a small amount of metal atoms (Ta, Al, etc.) contained therein dissolve in the etching solution, and part of the metal atoms diffuse into the oxide films 10. However, the atoms do not reach the semiconductor substrate 1 because the insulating films 10 are thick. Then the semiconductor substrate 1 is hardly contaminated with the metal atoms occurring in the wet etching. This enables MOSFET with reduced leakage current.

5. Fifth Preferred Embodiment

Figure 27:
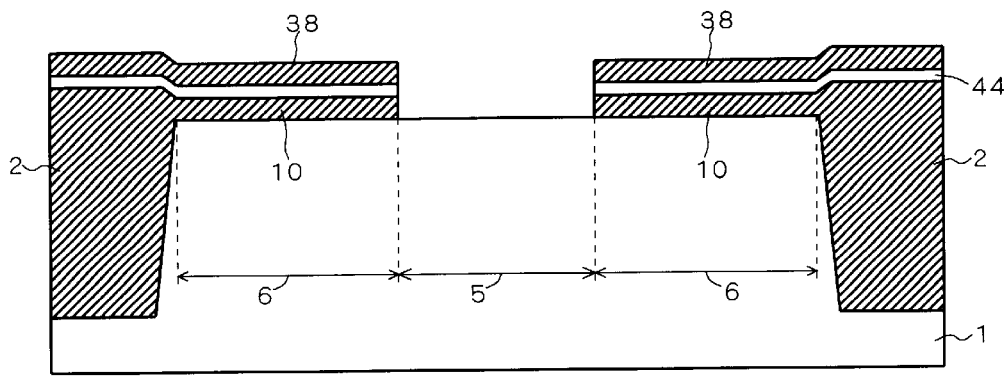
FIGS. 27 to 30 are process diagrams showing a manufacturing method of a fifth preferred embodiment.

FIGS. 27 to 30 are manufacturing process diagrams showing a semiconductor device manufacturing method of the fifth preferred embodiment. In the manufacturing method of this preferred embodiment, the process shown in FIG. 1 of the first preferred embodiment is performed first and then the process shown in FIG. 27 is performed.

In the process of FIG. 27, first, an oxide film (silicon oxide film) is formed on the main surface of the semiconductor substrate 1. The oxide film is formed by thermal oxidation after the underlying oxide film 48 is removed. For another method, the underlying oxide film 48 may be used as it is. Next, a polysilicon film and a nitride film (silicon nitride film) are deposited in this order on the oxide film. After that it is patterned by selective etching using resist to form the insulating films 10 as a silicon oxide film, a polysilicon film 44, and a nitride film 38 in this order on the source/drain regions 6. The patterning causes the main surface of the semiconductor substrate 1 to be exposed in the channel region 5.

Figure 28:
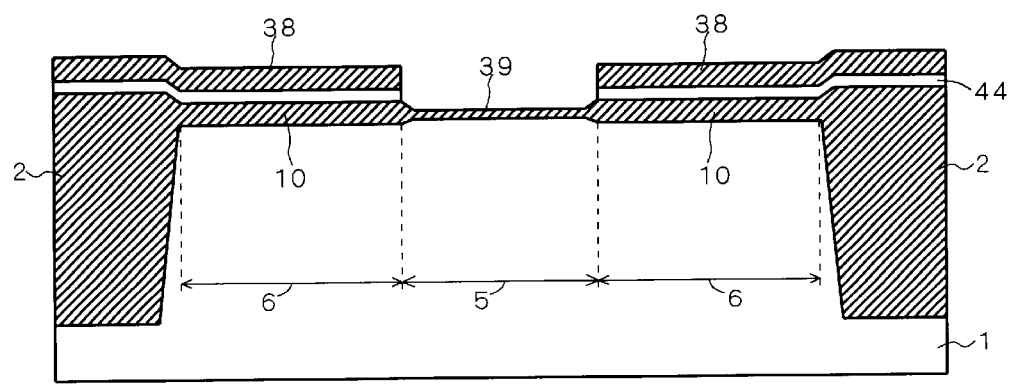

In the next process of FIG. 28, a thermal oxidation is performed. This forms an oxide film 39 on the main surface of the semiconductor substrate 1 in the area corresponding to the channel region 5. The oxidation hardly occurs in the areas corresponding to the source/drain regions 6 in the main surface of the semiconductor substrate 1, since these areas are covered by the nitride film 38. Hence the film thickness of the oxide films 10 is almost unchanged before and after the thermal oxidation. The thermal oxidation is performed in such a way that the oxide film 39 is thinner than the insulating films 10. While bird's beaks are formed at the boundaries between the oxide film 39 and the insulating films 10, stresses are reduced because the polysilicon film 44 covers the films.

Figure 29:
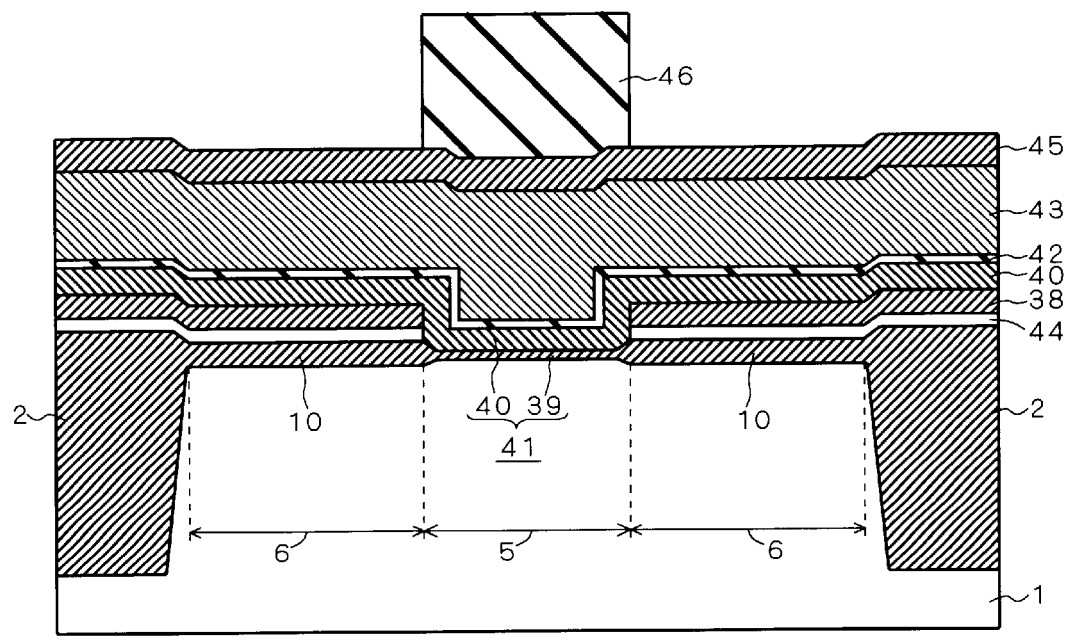

In the next process of FIG. 29, first, the high-dielectric-constant film 40, the titanium nitride film 42, the tungsten film 43, and an anti-reflection insulating film 45 are deposited in this order over the entire upper surface of the structure obtained after the process of FIG. 28. Next, resist is applied on the anti-reflection insulating film 45 and then the resist 46 is formed above the channel region 5 by mask patterning.

The oxide film 39 and the high-electric-constant film 40 in the part located above the channel region 5 form the gate insulating film 41. The thicknesses of the oxide film 39 and the high-dielectric-constant film 40 are set so that the gate insulating film 41 is thinner than the insulating films 10. The oxide film 39 is interposed between the high-dielectric-constant film 40 and the semiconductor substrate 1 for the same purpose as that described in the fourth preferred embodiment. The titanium nitride film 42 is deposited also for the same purpose as the fourth preferred embodiment.

If the resist 46 is deposited on the tungsten film 43 without depositing the anti-reflection insulating film 45, halation occurs because of the high reflectance of the tungsten film 43 and the differences in height. Then the line width of the resist 46 may become thinner than the mask pattern. However, in the process of FIG. 29, the anti-reflection insulating film 45 having a small reflectance is deposited to effectively prevent the halation. A nitride film deposited by plasma CVD may substitute for the anti-reflection insulating film 45.

Figure 30:
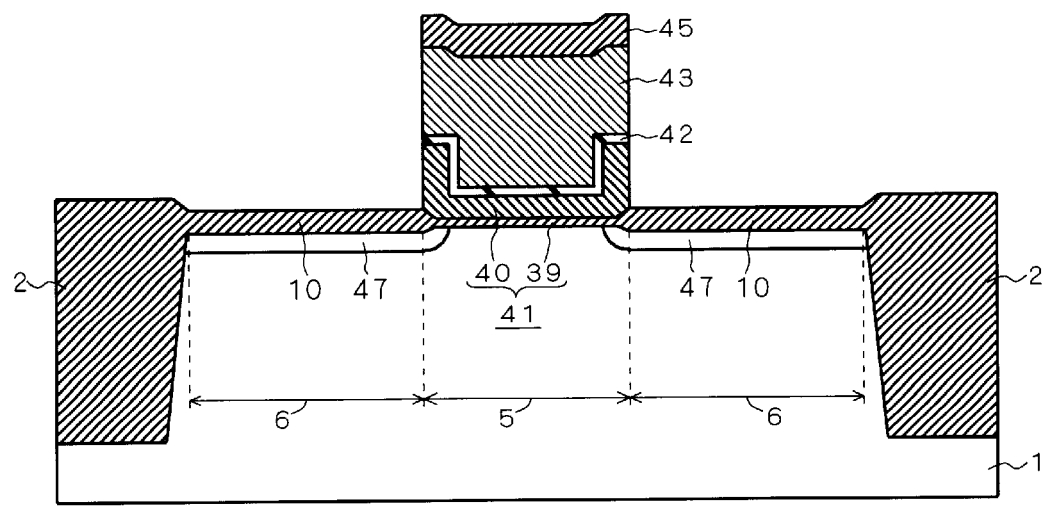

In the next process of FIG. 30, reactive ion etching is performed by using the resist 46 as a mask. Then the gate electrode is formed above the channel region 5. Next, impurities are selectively implanted into the main surface of the semiconductor substrate 1 by using the gate electrode as a mask. Then (first) source/drain impurity layers 47 are formed in a self-aligned manner in the main surface of the semiconductor substrate 1 in the areas corresponding to the source/drain regions 6. After that the processes of FIGS. 4 to 7 in the first preferred embodiment are performed to complete the MOS transistor.

Also in the manufacturing method of this preferred embodiment, the insulating films 10 on the source/drain regions 6 are formed thicker than the gate insulating film 41 on the channel region 5. Accordingly, even if metal (W) is used as the material of the gate electrode and the gate insulating film includes a high-dielectric-constant film, formation of defects and levels in the semiconductor substrate 1 can effectively be suppressed when forming the gate electrode by reactive ion etching. This reduces the leakage current.

Furthermore, since the gate insulating film 41 and the insulating films 10 are formed to different thicknesses through the processes of FIGS. 27 to 29 without forming a barrier like the nitride film 114 (FIG. 58) on the channel region 5, it is possible to reduce the stresses caused by the thermal oxidation around the connections between the gate insulating film 41 and the insulating films 10. Accordingly, like the manufacturing methods of the first to fourth preferred embodiments, the manufacturing method of this preferred embodiment can compatibly realize the reduction in leakage current and the improvement of the reliability of the gate insulating film 41.

6. Sixth Preferred Embodiment

The following preferred embodiments show methods in which an alignment mark for positioning mask pattern is formed in the manufacturing methods of the first to third, and fifth preferred embodiments. FIGS. 31 to 36 are manufacturing process diagrams showing a semiconductor device manufacturing method of the sixth preferred embodiment. In the following diagrams, the sectional views on the left side show the transistor formation portion 51 and the sectional views on the right side show the alignment mark formation portion 52.

In the manufacturing method of this preferred embodiment, alignment mark for positioning the mask pattern is formed in the manufacturing method of the first preferred embodiment. In this manufacturing method, the process shown in FIG. 1 in the first preferred embodiment is performed first. In the process of FIG. 1, the STI 2 is selectively formed in the main surface of the semiconductor substrate 1 and then the underlying oxide film 48 is formed on the entire main surface of the semiconductor substrate 1. Next the well layer 91 and the channel-cut layer 92 are formed by ion implantation in both of the transistor formation portion 51 and the alignment mark portion 52. Alternatively, the well layer 91 and the channel-cut layer 92 are not formed in the alignment mark portion 52.

Figure 31:
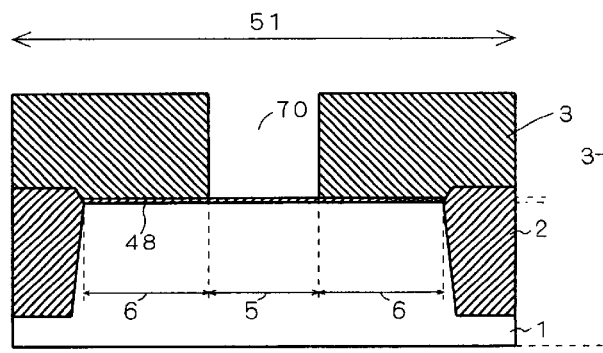
FIGS. 31 to 36 are process diagrams showing a manufacturing method of a sixth preferred embodiment.
Figure 31A:
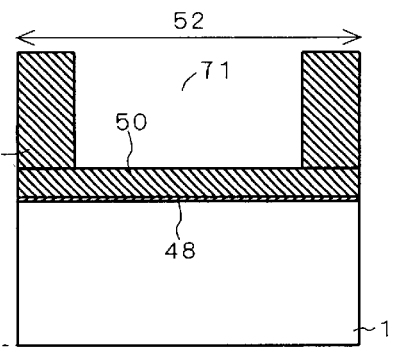

Then the process shown in FIG. 31 is performed. In the process shown in FIG. 31, a nitride film (silicon nitride film)

is deposited over the semiconductor substrate 1. Next, resist is applied on the nitride film and the resist is patterned to cover only the alignment mark formation portion 52. Next, wet etching process is performed by using the patterned resist as a mask to remove the nitride film in the part covering the transistor formation portion 51, thus forming a nitride film 50 covering only the alignment mark formation portion 52.

Subsequently, resist is applied again on the entire upper surface of the structure and the resist is patterned to form the resist 3. The resist 3 has the opening 70 above the channel region 5 in the transistor formation portion 51 and an opening 71 above the portion where an alignment mark is to be formed in the alignment mark formation portion 52.

Figure 32:
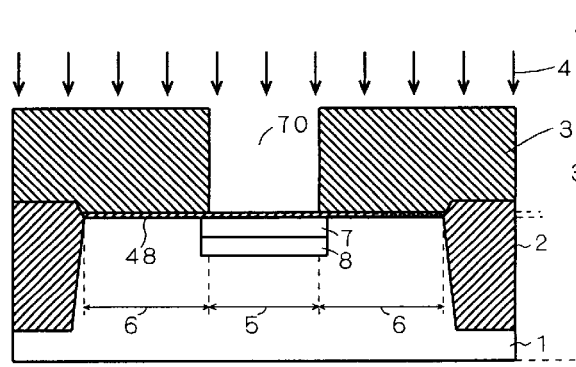
Figure 32A:
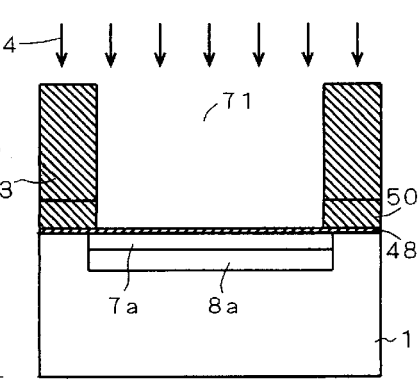

In the next process shown in FIG. 32, ion implantation is performed by using the resist 3 as a mask to selectively form the channel implant layer 7 containing nitrogen and the punch-through stopper layer 8. Through this process, a channel implant layer 7a and a punch-through stopper layer 8a are selectively formed right under the opening 71 also in the alignment mark formation portion 52. However, the channel implant layer 7a and the punch-through stopper layer 8a in the alignment mark formation portion 52 are formed shallower than the channel implant layer 7 and the punch-through stopper layer 8 because of the presence of the nitride film 50.

After that, the nitride film 50 exposed in the opening 71 is removed by wet etching. This wet etching leaves the underlying oxide film 48 almost nonetched due to large selectivity ratio between the nitride film 50 and the underlying oxide film 48.

Figure 33:
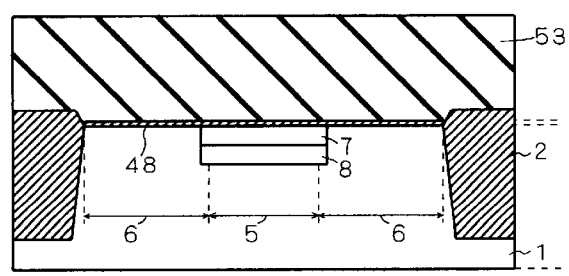
Figure 33A:
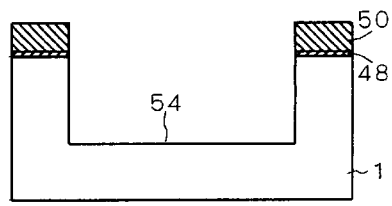

In the next process shown in FIG. 33, the resist 3 is removed first and then new resist is applied on the entire upper surface of the structure. Then the resist is patterned to form resist 53. The resist 53 is formed to cover only the transistor formation portion 51.

Next, in the alignment mark formation portion 52, the underlying oxide film 48 and the main surface of the semiconductor substrate 1 in the exposed part not covered by the nitride film 50 are removed by reactive ion etching using the resist 53 and the nitride film 50 as masks. This forms a trench 54 as a part of the alignment mark. Since the selectivity of the underlying oxide film 48 and the semiconductor (silicon) substrate 1 with respect to the nitride film 50 is so large in the reactive ion etching, the nitride film 50 remains unremoved in the etching process. While the resist 53 is also somewhat removed in the etching process, the etching does not damage the transistor formation portion 51.

Figure 34:
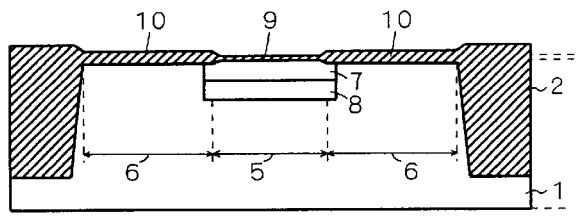
Figure 34A:
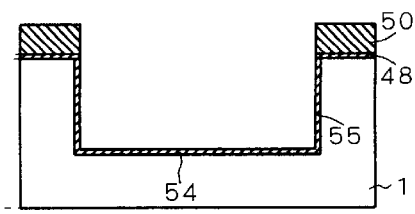

In the next process shown in FIG. 34, the resist 53 is removed first and the underlying oxide film 48 is removed by wet etching in the part not covered by the nitride film 50. Then the main surface of the semiconductor substrate 1 is exposed in the transistor formation portion 51. Next, thermal oxidation is performed in a dry $O_2$ atmosphere, for example, to form the gate insulating film 9, the insulating films 10, and an inner-wall oxide film 55. The gate insulating film 9 and the insulating films 10 are formed as silicon oxide film.

The alignment mark formation portion 52 is covered by the nitride film 50 except in the trench 54, so that the inner wall of the trench 54 is mainly oxidized. After the oxidizing process, the nitride film 50 covering part of the alignment mark formation portion 52 is removed by wet etching. Alternatively, the nitride film 50 covering part of the alignment mark formation portion 52 may be left unremoved, without removed.

Figure 35:
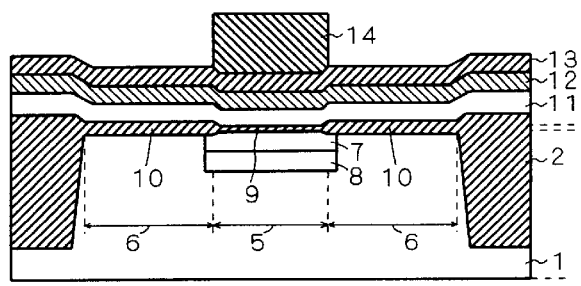
Figure 35A:
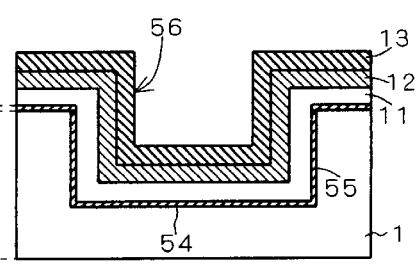

In the next process shown in FIG. 35, the impurity-doped polysilicon film 11, the WSi film 12, and the insulating film 13 are deposited in this order over the entire surface of the structure. These films are deposited not only on the transistor formation portion 51 but also on the inner wall of the trench 54 in the alignment mark portion 52. As a result, an alignment mark edge 56 which can be used as alignment mark is formed in the trench 54.

Next, resist is applied on the entire surface of the structure and a mask is aligned by use of the alignment mark edge 56 as a reference of alignment (positioning) to pattern the resist. Thus the resist 14 is accurately formed above the channel region 5. The alignment mark edge 56 can be easily detected since it is a difference in height. Further, the trench 54 is also shaped by the resist 3 which defines the channel region 5. Thus, both are positioned by transferring a common mask pattern. Therefore the resist 14 can be accurately formed above the channel region 5 with almost no mask alignment.

Figure 36:
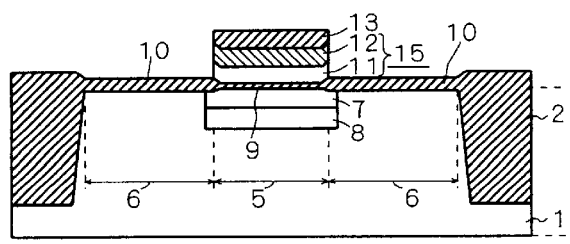
Figure 36A:
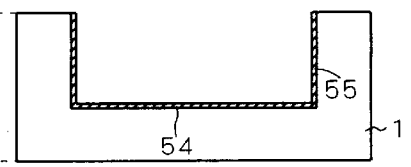

In the next process shown in FIG. 36, the gate electrode 15 is formed by reactive ion etching using the resist 14 as a mask. During this process, the resist 14 is removed by over etching. The multi-layered structure of the films 11, 12, and 13 covering the alignment mark formation portion 52 is also removed at the same time. The following processes are the same as those described in the first preferred embodiment.

The alignment mark, which is formed in an area other than the transistor formation portion 51 in the main surface of the semiconductor substrate 1, may be formed on the same chip or on the same wafer at plural positions. This also applies to the following preferred embodiments.

7. Seventh Preferred Embodiment

FIGS. 37 to 41 are manufacturing process diagrams showing a semiconductor device manufacturing method according to the seventh preferred embodiment. In the manufacturing method of this preferred embodiment, an alignment mark for mask pattern positioning is formed in the manufacturing method of the second preferred embodiment. Also in this manufacturing method, the process shown in FIG. 1 is performed first as in the sixth preferred embodiment. This process is not explained here because it has already been explained in the sixth preferred embodiment.

Figure 37:
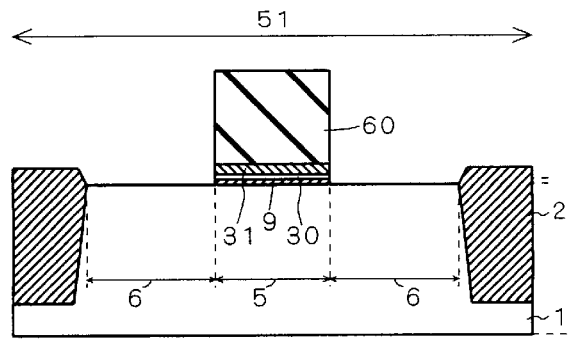
FIGS. 37 to 41 are process diagrams showing a manufacturing method of a seventh preferred embodiment.
Figure 37A:
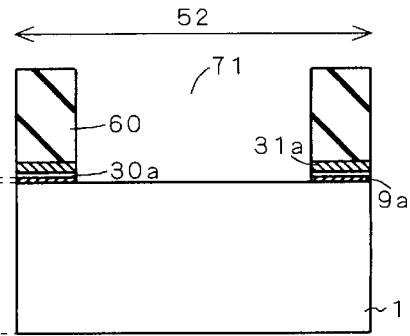

Next the process shown in FIG. 37 is performed. In the process of FIG. 37, an oxide film (corresponding to the oxide film 29 in FIG. 14) is formed on the main surface of the semiconductor substrate 1 and then a polysilicon film and a nitride film (silicon nitride film) are deposited in this order over the entire upper surface of the structure. Subsequently, resist is applied on the nitride film and the resist is patterned to form resist 60. The resist 60 is formed only above the channel region 5 in the transistor formation portion 51, and it has the opening 71 in the alignment mark formation portion 52 only above the part where the alignment mark is to be formed.

After this, wet etching is performed by using the resist 60 as a mask to remove the oxide film, the polysilicon film and the nitride film located in the regions uncovered by the resist 60. Thus the gate insulating film 9 as a silicon oxide film, the polysilicon film 30, and the nitride film 31 are formed on the channel region 5 in the transistor formation portion 51, and an insulating film 9a as an oxide film, a polysilicon film 30a, and a nitride film 31a are formed in the alignment mark formation portion 52 except in the opening 71.

Figure 38:
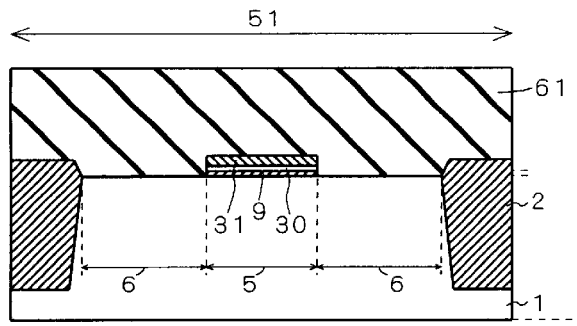
Figure 38A:
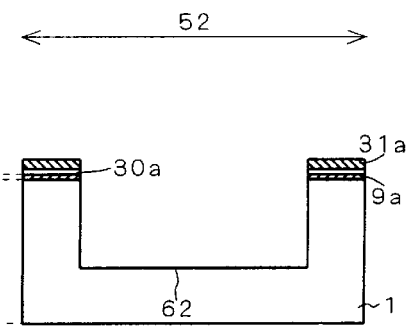

In the next process shown in FIG. 38, the resist 60 is removed first and then new resist is applied on the entire upper surface of the structure. Then the applied resist is patterned to form resist 61 covering only the transistor formation region 51. Next, reactive ion etching is carried out by using the resist 61 and the insulating film 9a, the polysilicon film 30a, and the nitride film 31a formed in the alignment mark formation portion 52 as masks. This removes, in the alignment mark formation portion 52, part of the main surface of the semiconductor substrate 1 which is exposed without covered by the insulating film 9a, the polysilicon film 30a, and the nitride film 31a. As a result, a trench 62 is formed as part of the alignment mark.

Figure 39:
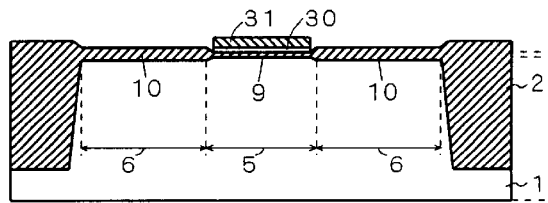
Figure 39A:
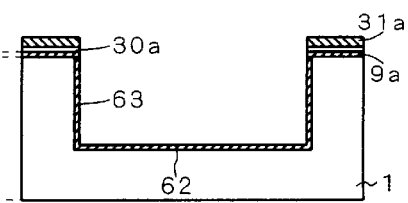

In the next process shown in FIG. 39, the resist 61 is removed first and then thermal oxidation is performed in a dry $O_2$ atmosphere, for example. This forms the insulating films 10 as a silicon oxide film and an inner-wall oxide film 63 on the surface of the semiconductor substrate 1. In the alignment mark formation portion 52, the inner wall of the trench 62 is mainly oxidized since the part except the trench 62 is covered by the nitride film 31a. Thereafter, the nitride films 31 and 31a and the polysilicon films 30 and 30a are removed by wet etching.

Figure 40:
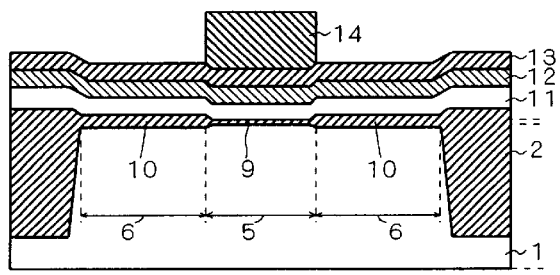
Figure 40A:
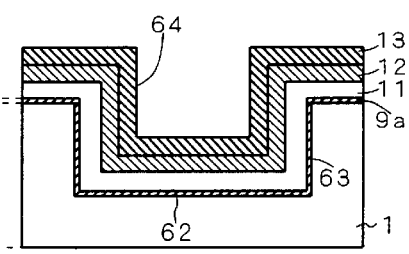

In the next process shown in FIG. 40, first, the impurity-doped polysilicon film 11, the WSix film 12, and the insulating film 13 are deposited in this order on the entire surface of the structure. These films are deposited not only on the transistor formation portion 51 but also on the inner wall of the trench 62 in the alignment mark formation portion 52. As a result, an alignment mark edge 64 which can be used as the alignment mark is formed in the trench 62.

Next, resist is applied on the entire surface of the structure and a mask is aligned by use of the alignment mark edge 56 as a reference of alignment (positioning), and the resist is patterned. Thus the resist 14 is accurately formed above the channel region 5. The alignment mark edge 64 can be easily detected since it is a difference in height. The trench 62 is also shaped by the resist 60 which defines the channel region 5. Thus, both are positioned by transferring a common mask pattern. Therefore the resist 14 can be accurately formed above the channel region 5 with almost no mask alignment.

Figure 41:
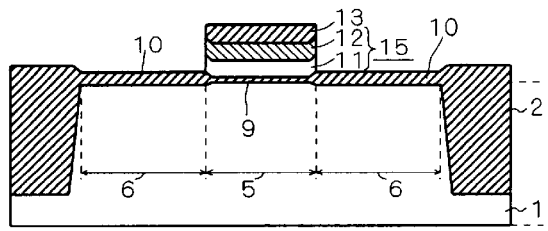
Figure 41A:
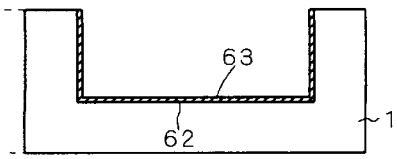

In the next process shown in FIG. 41, the gate electrode 15 is formed by reactive ion etching using the resist 14 as a mask. During this process, the resist 14 is removed by over etching. The multi-layered structure of films 11, 12, and 13 covering the alignment mark formation portion 52 is also removed at the same time. The following processes are the same as those described in the second preferred embodiment.

8. Eighth Preferred Embodiment

FIGS. 42 to 48 are manufacturing process diagrams showing a semiconductor device manufacturing method according to the eighth preferred embodiment. In the manufacturing method of this preferred embodiment, the alignment mark for mask pattern positioning is formed in the manufacturing method of the third preferred embodiment. Also in this manufacturing method, the process shown in FIG. 1 is performed first as in the sixth preferred embodiment.

Figure 42:
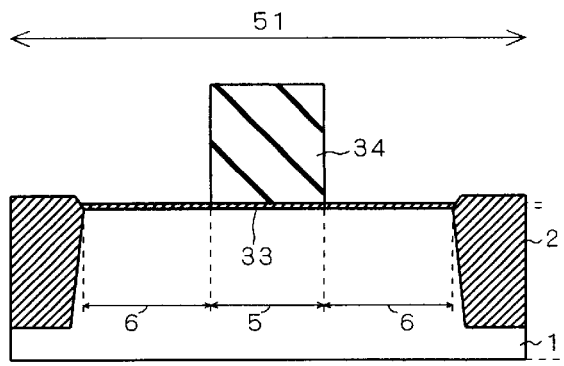
FIGS. 42 to 48 are process diagrams showing a manufacturing method of an eighth preferred embodiment.
Figure 42A:
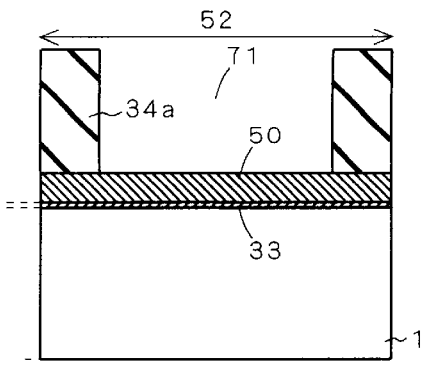

The process shown in FIG. 42 is performed next. In the process shown in FIG. 42, the oxide film (silicon oxide film) 33 is formed first on the main surface of the semiconductor substrate 1 and then a nitride film (silicon nitride film) is deposited on the entire upper surface of the structure. Subsequently resist is patterned to cover only the alignment mark formation portion 52. Next wet etching is performed by using the patterned resist as a mask to remove the part of the nitride film which covers the transistor formation portion 51, thus forming a nitride film 50 covering only the alignment mark formation portion 52.

Subsequently, resist is applied again on the entire upper surface of the structure and patterned to form the resist 34. The resist 34 is formed only on the channel region 5 in the transistor formation portion 51, and it forms the opening 71 in the alignment mark formation portion 52 only above the part where the alignment mark is to be formed.

Figure 43:
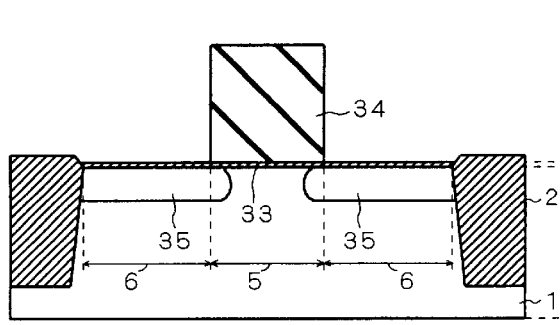
Figure 43A:
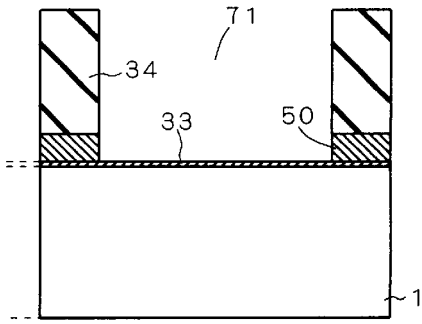

In the next process shown in FIG. 43, arsenic is selectively ion-implanted into the main surface of the semiconductor substrate 1 by using the resist 34 and the nitride film 50 as masks, with an implant energy of 20 keV and a dose of $1 \times 10^{14}/cm^2$, for example. This selectively forms the high-concentration impurity layers 35 in the main surface of the semiconductor substrate 1. Arsenic is also implanted into the nitride film 50 in the part located right under the opening 71. After that, wet etching is carried out by using the resist 34 as a mask to remove the nitride film 50 right under the opening 71.

Figure 44:
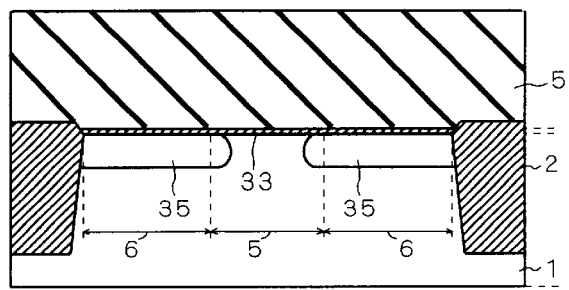
Figure 44A:
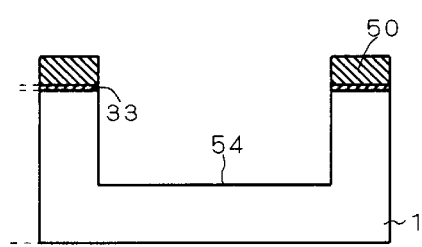

In the next process shown in FIG. 44, the resist 34 is removed and then new resist is applied on the entire upper surface of the structure. Next, the applied resist is patterned to form the resist 53 covering only the transistor formation region 51. Next, reactive ion etching is performed by using the resist 53 and the nitride film 50 left in the alignment mark formation portion 52 as masks. This removes the main surface of the semiconductor substrate 1 in the area exposed without covered by the nitride film 50 in the alignment mark formation portion 52. Thus the trench 54 is formed as part of the alignment mark.

Figure 45:
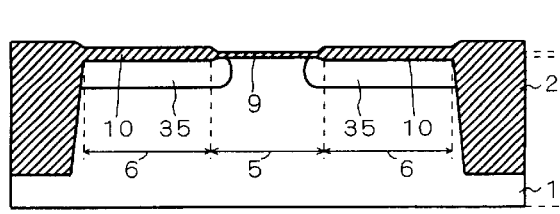
Figure 45A:
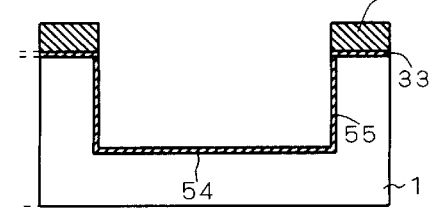

In the next process shown in FIG. 45, the resist 53 is removed first and the oxide film 33 is selectively removed by using the nitride film 50 as a mask. This causes the main surface of the semiconductor substrate 1 to be exposed in the transistor formation portion 51. After that, thermal oxidation is performed in a dry $O_2$ atmosphere, for example. As a result, the gate insulating film 9 and the insulating films 10 are formed on the main surface of the semiconductor substrate 1 in the transistor formation portion 51. The gate insulating film 9 and the insulating films 10 are both formed as silicon oxide film. The alignment mark formation portion 52 is covered by the nitride film 50 except in the trench 54, so that the inner wall of the trench 54 is mainly oxidized to form the inner-wall oxide film 55.

Figure 46:
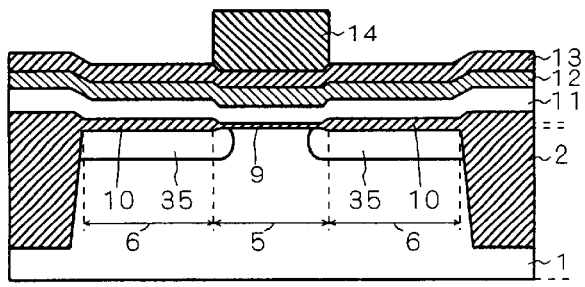
Figure 46A:
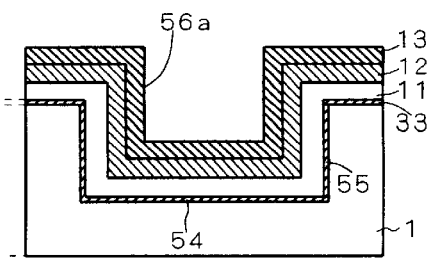

In the next process shown in FIG. 46, the nitride film 50 is removed first. Alternatively, the nitride film 50 may be left unremoved. Subsequently, the impurity-doped polysilicon film 11, the WSix film 12, and the insulating film 13 are deposited in this order on the entire surface of the structure. These films are deposited not only on the transistor formation portion 51 but also on the inner wall of the trench 54 in the alignment mark formation portion 52. As a result, an alignment mark edge 56a which can be used as the alignment mark is formed inside the trench 54.

Next, resist is applied to the entire surface of the structure and then a mask is aligned by use of the alignment mark edge 56a as reference to pattern the resist. Thus the resist 14 is accurately formed above the channel region 5. The alignment mark edge 56a can be easily detected since it is a difference in height. Further, the trench 54 is also shaped by the resist 34 which defines the channel region 5. Thus, both are positioned by transferring a common mask pattern. Accordingly the resist 14 can accurately be formed above the channel region 5 with almost no mask alignment.

Figure 47:
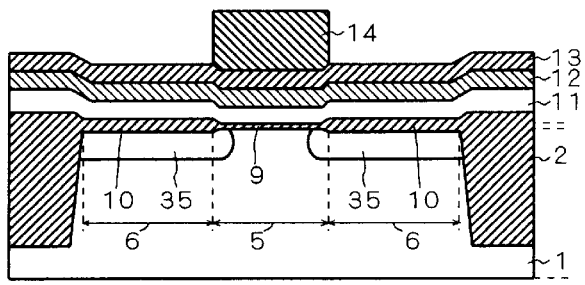
Figure 47A:
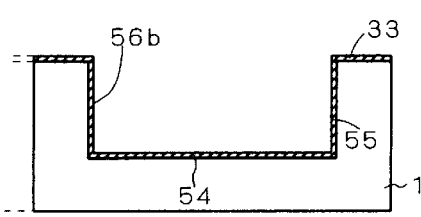

In order to further enhance the alignment accuracy, as shown in FIG. 47, the polysilicon film 11, the WSix film 12 and the insulating film 13 in the alignment mark formation portion 52 may be removed before formation of the resist 14.

Then the mask alignment for forming the resist 14 can be performed by using the surface of the inner-wall oxide film 55 formed on the sides of the trench 54 as the alignment mark edge 56b. This eliminates the alignment error due to variations in thickness of the polysilicon film 11, WSix film 12 and insulating film 13, thus enabling more accurate alignment.

The thickness of the inner-wall oxide film 55 is approximately equal to the thickness T of the gate insulating film 9. Hence the positional shift between the position of the side of the trench 54 before formation of the inner-wall oxide film 55 and the position of the surface of the inner-wall oxide film 55 on the side of the trench 54 after formation of the inner-wall oxide film 55 can be represented as $T \times (1-\alpha)$. Where the constant $\alpha$ represents the thickness of silicon consumed while silicon is oxidized to form an oxide film having a thickness of "1," whose value is about 0.44. Hence, if the thickness T is 2 nm, then the positional shift is about 1.12 nm. It can be said that the alignment error due to the positional shift is very small even if the gate length is 0.1 $\mu$m, for example. When the alignment is performed by considering the positional shift of about 1.12 nm, the alignment accuracy can be further enhanced.

Also, the inner-wall oxide film 55 may be removed by etching, and the side of the trench 54 in which the semiconductor substrate 1 is exposed can be used as the alignment mark edge.

To remove the polysilicon film 11, the WSix film 12, and the insulating film 13 in the alignment mark formation portion 52 as shown in FIG. 47, resist is applied on the insulating film 13 and patterned so that an opening is formed in the alignment mark formation portion 52, and then selective wet etching is performed by using the patterned resist. The resist is removed after that.

Figure 48:
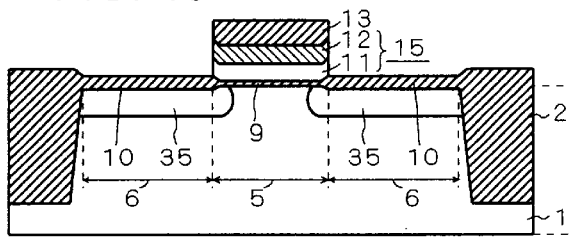
Figure 48A:
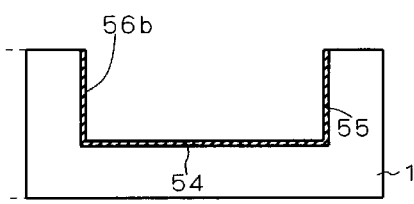

When the process of FIG. 46 or FIG. 47 is finished, the process shown in FIG. 48 is performed. In the process of FIG. 48, the gate electrode 15 is formed by reactive ion etching using the resist 14 as a mask. The resist 14 is removed by over etching during this process. When the process shown in FIG. 46 is adopted, the multi-layered structure of the films 11, 12, 13 covering the alignment mark formation portion 52 is removed at the same time. The following processes are performed as described in the third preferred embodiment.

9. Ninth Preferred Embodiment

FIGS. 49 to 54 are manufacturing process diagrams showing a semiconductor device manufacturing method of the ninth preferred embodiment. In this manufacturing method, the alignment mark for mask pattern positioning is formed in the manufacturing method of the fifth preferred embodiment. Also in this manufacturing method, the process shown in FIG. 1 is performed first as in the sixth preferred embodiment.

Figure 49:
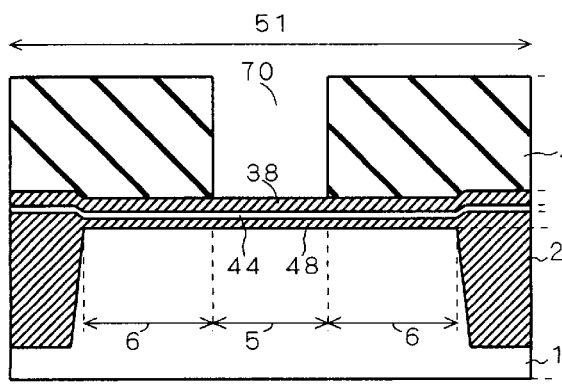
Figure 49A:
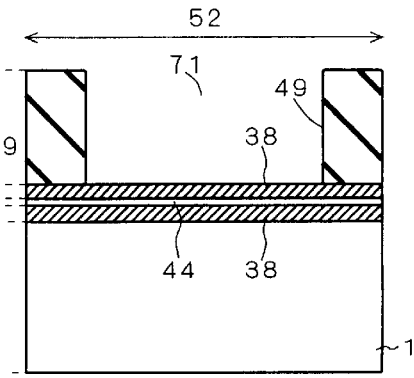

Subsequently, the process shown in FIG. 49 is performed. In the process shown in FIG. 49, the polysilicon film 44 and the nitride film (silicon nitride film) 38 are first deposited in this order over the entire upper surface of the structure and resist is applied over the entire upper surface of the nitride film 38.

Next, the resist is patterned to form resist 49. The resist 49 has the opening 70 above the channel region 5 in the transistor formation portion 51 and the opening 71 above the part in which the alignment mark is to be formed in the alignment mark formation portion 52.

In the next process shown in FIG. 50, selective etching is performed by using the resist 49 as a mask to remove the polysilicon film 44 and the nitride film 38 right under the openings 70 and 71. Next the resist 49 is removed. The underlying oxide film 48 is left unremoved till just before thermal oxidation process performed later. The underlying oxide film 48 serves to protect the channel region 5 from contamination.

In the next process shown in FIG. 51, new resist is applied on the entire upper surface of the structure. Next, the applied resist is patterned to form the resist 67 covering only the transistor formation region 51. Next, reactive ion etching is performed by using the resist 67 and the nitride film 38 left in the alignment mark formation portion 52 as masks. This removes the part of the main surface of the semiconductor substrate 1 which is exposed without covered by the nitride film 38 in the alignment mark formation portion 52. Thus the trench 54 is formed as part of the alignment mark. In this process, the underlying oxide film 48 serves to prevent the main surface of the semiconductor substrate 1 in the channel region 5 from being contaminated by the resist 67.

In the next process shown in FIG. 52, the resist 67 is removed first and then the underlying oxide film 48 is selectively removed by using the nitride film 38 as a mask. Thus the main surface of the semiconductor substrate 1 is exposed in the channel region 5.

In the next process shown in FIG. 53, thermal oxidation is performed in a dry $O_2$ atmosphere, for example. This forms the gate insulating film 9 as a silicon oxide film on the main surface of the semiconductor substrate 1 in the channel region 5. The underlying oxide film 48 on the semiconductor substrate 1 in the source/drain regions 6 forms the insulating films 10. Because the alignment mark formation portion 52 is covered by the nitride film 38 except in the trench 54, the inner wall of the trench 54 is mainly oxidized and the inner-wall oxide film 55 is formed.

Subsequently, the high-dielectric-constant film 40, the titanium nitride film 42, the tungsten film 43, and the anti-reflection insulating film 45 are deposited in this order over the entire upper surface of the structure. These films are deposited not only on the transistor formation portion 51 but also on the inner wall of the trench 54 in the alignment mark portion 52. As a result, the alignment mark edge 56 which can be used as the alignment mark is formed inside the trench 54.

Next, resist is applied to the entire surface of the structure and then a mask is aligned by use of the alignment mark edge 56 as a reference of alignment, and the resist is patterned. Thus the resist 46 is accurately formed above the channel region 5. The alignment mark edge 56 can be easily detected since it is a difference in height. Further, the trench 54 is also shaped by the resist 49 which defines the channel region 5. Thus, both are positioned by transferring a common mask pattern. Accordingly the resist 14 can accurately be formed above the channel region 5 with almost no mask alignment.

Although not shown in diagram, as described in the eighth preferred embodiment, the alignment accuracy can be further enhanced by performing the alignment after removing the high-dielectric-constant film 40, the titanium nitride film 42, the tungsten film 43, and the anti-reflection insulating film 45 deposited on the inner wall of the trench 54.

Figure 54:
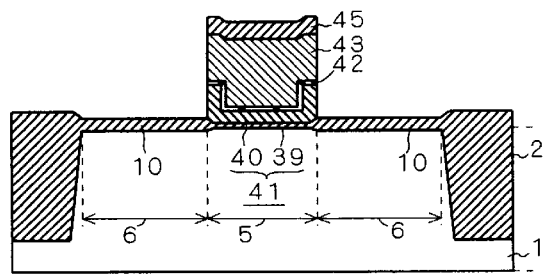
Figure 54A:
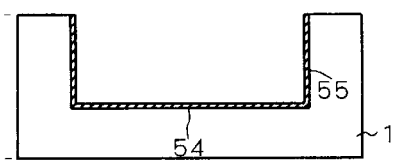
Figure 55:
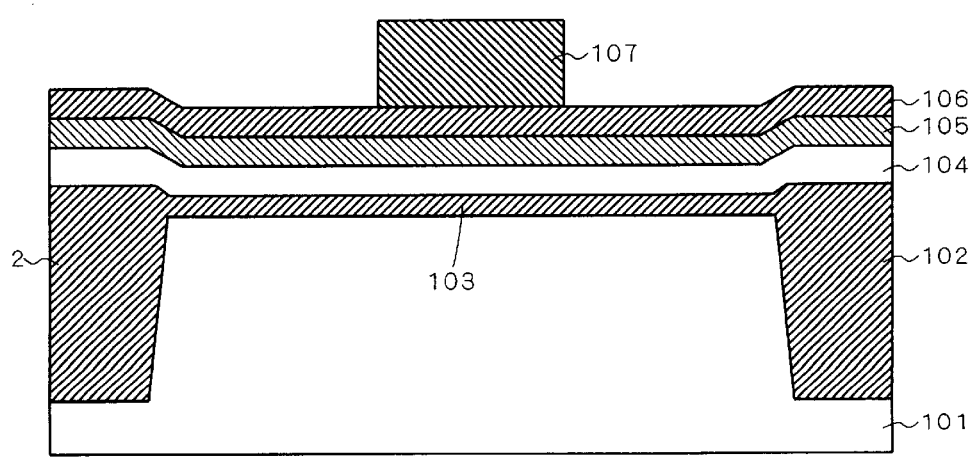
FIGS. 55 and 56 are process diagrams showing a conventional manufacturing method.
Figure 56:
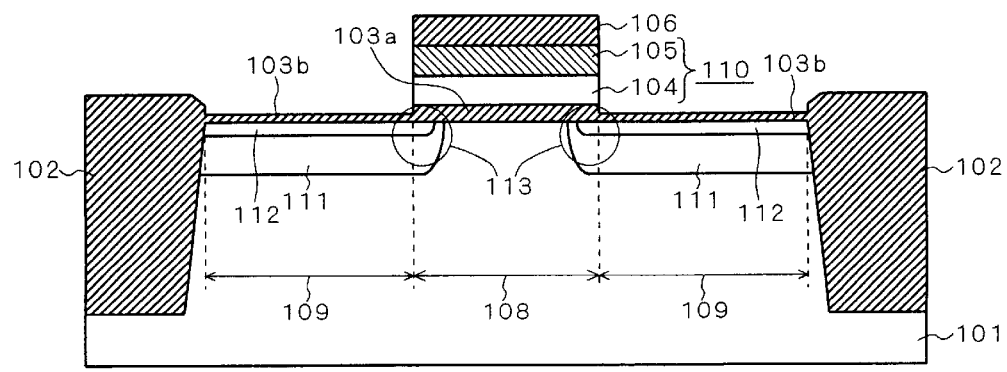
Figure 57:
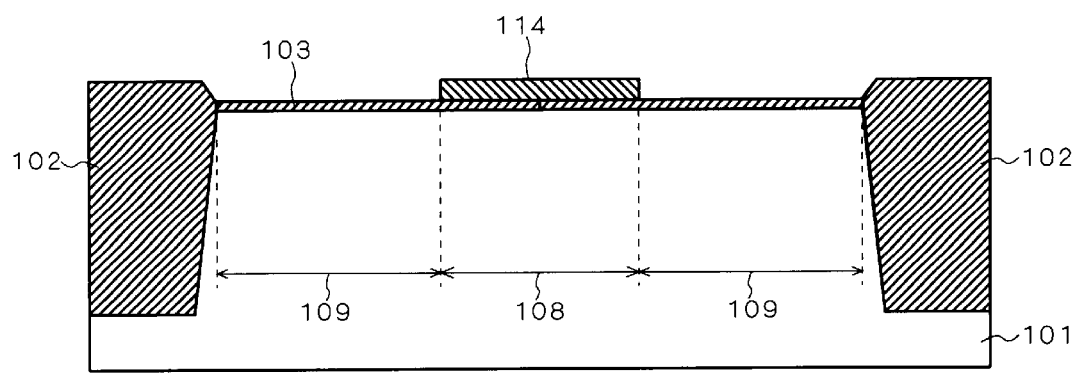
FIGS. 57 and 58 are process diagrams showing another conventional manufacturing method.

In the next process shown in FIG. 54, the gate electrode 15 is formed by reactive ion etching using the resist 46 as a mask. During this process the resist 46 is removed by over etching. The multi-layered structure of the films 40, 42, 43, 45 covering the alignment mark formation portion 52 is also removed at the same time. The following processes are the same as those described in the fifth preferred embodiment.

10. Modifications

Although the sixth to ninth preferred embodiments have shown examples in which a trench is formed as the alignment mark, other marks than trench can be formed. However, since the side wall which defines a difference in height can be used as a mark, the trench is advantageous in that the mark can easily be detected and that the alignment can be performed more accurately.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device having a channel region selectively formed in a main surface of a semiconductor substrate, a set of source/drain regions selectively formed in said main surface of said semiconductor substrate with said channel region interposed therebetween, and a gate electrode facing said channel region through a gate insulating film, said method comprising the steps of:
   (a) preparing said semiconductor substrate;
   (b) oxidizing said main surface of said semiconductor substrate to form an insulating film on said main surface;
   (c) depositing a polycrystalline semiconductor film and a nitride film in this order on said insulating film in an area located above said channel region;
   (d) after said step (c), oxidizing said main surface of said semiconductor substrate so that said insulating film becomes thicker in said set of source/drain regions than in said channel region;
   (e) removing said polycrystalline semiconductor film and said nitride film;
   (f) depositing an electrode material on said insulating film; and
   (g) selectively removing said electrode material by using a selective etching to form said gate electrode.

2. The semiconductor device manufacturing method according to claim 1, further comprising a step (A) of heating at a temperature of 950° C. or higher after said step (d).

3. The semiconductor device manufacturing method according to claim 1, further comprising a step (B) of forming a mark in an area other than said channel region and said source/drain regions in said main surface of said semiconductor substrate,
   wherein positioning of deposition of said polycrystalline semiconductor film and said nitride film in said step (c) and positioning of said mark in said step (B) are achieved by transferring a common mask pattern, and
   in said step (g), the position in which said electrode material is selectively removed is determined through transfer of another mask pattern, and said another mask pattern is positioned on the basis of the position of said mark.

4. The semiconductor device manufacturing method according to claim 3, wherein, in step (B), a trench is formed as said mark.

5. The semiconductor device manufacturing method according to claim 4, wherein, in step (f), said electrode material is also deposited on an inner surface of said trench, and said method further comprises a step of:
   (C) after said step (f) and before said step (g), removing said electrode material from said inner surface of said trench.

6. The semiconductor device manufacturing method according to claim 5, wherein, in step (d), said insulating film is also formed on an inner surface of said trench, and in said step (C) said insulating film is also removed from said inner surface of said trench.

7. A method of manufacturing a semiconductor device having a channel region selectively formed in a main surface of a semiconductor substrate, a set of source/drain regions selectively formed in said main surface of said semiconductor substrate with said channel region interposed therebetween, and a gate electrode facing said channel region through a gate insulating film, said method comprising the steps of:
   (a) preparing said semiconductor substrate;
   (b) oxidizing said main surface of said semiconductor substrate to form an insulating film on said main surface;
   (c) applying a selective etching to selectively remove said insulating film on said channel region;
   (d) after said step (c), oxidizing said main surface of said semiconductor substrate to form on said channel region an insulating film thinner than said insulating film on said set of source/drain regions;
   (e) depositing an electrode material over said insulating films on said channel region and said source/drain regions; and
   (f) selectively removing said electrode material by using a selective etching to form said gate electrode.

8. The semiconductor device manufacturing method according to claim 7, further comprising a step (A) of heating at a temperature of 950° C. or higher after said step (e).

9. The semiconductor device manufacturing method according to claim 7, further comprising a step (B) of forming a mark in an area other than said channel region and said source/drain regions in said main surface of said semiconductor substrate,
   wherein positioning of selective formation of said insulating film in said step (c) and positioning of said mark in said step (B) are achieved by transferring a common mask pattern, and
   in said step (f), the position in which said electrode material is selectively removed is determined through transfer of another mask pattern, and said another mask pattern is positioned on the basis of the position of said mark.

10. The semiconductor device manufacturing method according to claim 9, wherein, in step (B), a trench is formed as said mark.

11. The semiconductor device manufacturing method according to claim 10, wherein, in step (e), said electrode material is also deposited on an inner surface of said trench, and said method further comprises a step of:
    (C) after said step (e) and before said step (f), removing said electrode material from said inner surface of said trench.

12. The semiconductor device manufacturing method according to claim 11, wherein, in step (d), said insulating film is also formed on an inner surface of said trench, and in said step (C) said insulating film is also removed from said inner surface of said trench.

13. The semiconductor device manufacturing method according to claim 7, wherein said step (c) comprises:
    (c-1) depositing a semiconductor oxide film on said insulating film;

(c-2) depositing a nitride film on said semiconductor oxide film; and (c-3) applying selective etching to selectively remove said nitride film, said semiconductor oxide film, and said insulating film over said channel region.

14. A method of manufacturing a semiconductor device having a channel region selectively formed in a main surface of a semiconductor substrate, a set of source/drain regions selectively formed in said main surface of said semiconductor substrate with said channel region interposed therebetween, and a gate electrode facing said channel region through a gate insulating film, said method comprising the steps of:

(a) preparing said semiconductor substrate;

(b) oxidizing said main surface of said semiconductor substrate to form an insulating film on said main surface; and (c) applying a selective etching to selectively remove said insulating film on said channel region; wherein said step (c) comprises:

(c-1) depositing a film on said insulating film; and (c-2) applying selective etching to selectively remove said film deposited in said step (c-1) and said insulating film over said channel region, said method further comprising:

(d) after said step (c), oxidizing said main surface of said semiconductor substrate to form on said channel region an insulating film thinner than said insulating film on said set of source/drain regions;

(e) depositing an electrode material over said insulating films on said channel region and said source/drain regions;

(f) polishing said electrode material so as not to leave the same on said film deposited in said step (c-1) but to selectively leave over said channel region to form said gate electrode; and (g) removing said film deposited in said step (c-1).

15. The semiconductor device manufacturing method according to claim 14, further comprising a step (A) of heating at a temperature of 950° C. or higher after said step (e).

16. A method of manufacturing a semiconductor device having a channel region selectively formed in a main surface of a semiconductor substrate, a set of source/drain regions selectively formed in said main surface of said semiconductor substrate with said channel region interposed therebetween, and a gate electrode facing said channel region through a gate insulating film, said method comprising the steps of:

(a) preparing said semiconductor substrate;

(b) selectively introducing nitrogen into said main surface of said semiconductor substrate in an area which substantially corresponds only to said channel region;

(c) oxidizing said main surface of said semiconductor substrate to form an insulating film on said main surface so that said insulating film is formed thicker on said set of source/drain regions than on said channel region;

(d) depositing an electrode material on said insulating film; and (e) selectively removing said electrode material by using a selective etching to form said gate electrode.

17. The semiconductor device manufacturing method according to claim 16, further comprising a step of heating at a temperature of 950° C. or higher after said step (c).

18. The semiconductor device manufacturing method according to claim 16, further comprising a step of forming a mark in an area other than said channel region and said source/drain regions in said main surface of said semiconductor substrate, wherein positioning of selective introduction of nitrogen in said step (b) and positioning of said mark are achieved by transferring a common mask pattern, and in said step (e), the position in which said electrode material is selectively removed is determined through transfer of another mask pattern, and said another mask pattern is positioned on the basis of the position of said mark.

19. The semiconductor device manufacturing method according to claim 18, wherein said mark is a trench.

20. The semiconductor device manufacturing method according to claim 19, wherein, in said step (d), said electrode material is also deposited on an inner surface of said trench, and said method further comprises a step of removing said electrode material from said inner surface of said trench after said step (d) and before said step (e).

21. The semiconductor device manufacturing method according to claim 20, wherein, in said step (c), said insulating film is also formed on an inner surface of said trench, and wherein removing said electrode material also includes removing said insulating film from said inner surface of said trench.

22. A method of manufacturing a semiconductor device having a channel region selectively formed in a main surface of a semiconductor substrate, a set of source/drain regions selectively formed in said main surface of said semiconductor substrate with said channel region interposed therebetween, and a gate electrode facing said channel region through a gate insulating film, said method comprising the steps of:

(a) preparing said semiconductor substrate;

(b) oxidizing said main surface of said semiconductor substrate to form an insulating film on said main surface; and (c) applying a selective etching to selectively remove said insulating film on said channel region; wherein said step (c) comprises:

(c-1) depositing a film on said insulating film; and (c-2) applying selective etching to selectively remove said film deposited in said step (c-1) and said insulating film over said channel region, said method further comprising:

(d) forming on said channel region an insulating film thinner than said insulating film on said set of source/drain regions;

(e) depositing an electrode material over said insulating films on said channel region and said source/drain regions;

(f) polishing said electrode material so as not to leave the same on said film deposited in said step (c-1) but to selectively leave over said channel region to form said gate electrode; and (g) removing said film deposited in said step (c-1).

23. The semiconductor device manufacturing method according to claim 22, further comprising a step (B) of forming a mark in an area other than said channel region and said source/drain regions in said main surface of said semiconductor substrate, wherein positioning of deposition of said film in said step C-1 and positioning of said mark in said step (B) are achieved by transferring a common mask pattern, and in said step (f), the position in which said electrode material is selectively leaved is determined through transfer of another mask pattern, and said another mask pattern is positioned on the basis of the position of said mark.

24. The semiconductor device manufacturing method according to claim 23, wherein said mark is a trench.

25. The semiconductor device manufacturing method according to claim 24, wherein, in said step (e), said electrode material is also deposited on an inner surface of said trench, and said method further comprises a step of:

(C) after said step (e) and before said step (f), removing said electrode material from said inner surface of said trench.

26. The semiconductor device manufacturing method according to claim 25, wherein, in said step (d), said insulating film is also formed on an inner surface of said trench, and in said step (C), said insulating film is removed from said inner surface of said trench.

* * * * *